(12) United States Patent
Nakashima et al.

(10) Patent No.: US 8,354,141 B2
(45) Date of Patent: Jan. 15, 2013

(54) LIQUID TREATMENT APPARATUS, MOUNTING AND DISMOUNTING METHOD OF A CUP BODY, AND STORAGE MEDIUM

(75) Inventors: Tsunenaga Nakashima, Koshi (JP); Gouichi Iwao, Oita (JP); Naofumi Kishita, Koshi (JP); Nobuhiro Ogata, Koshi (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 13/114,346

(22) Filed: May 24, 2011

(65) Prior Publication Data

US 2011/0220216 A1 Sep. 15, 2011

Related U.S. Application Data

(62) Division of application No. 11/907,291, filed on Oct. 10, 2007, now Pat. No. 7,984,690.

(30) Foreign Application Priority Data

Oct. 23, 2006 (JP) ................................ 2006-287966
Apr. 27, 2007 (JP) ................................ 2007-119541

(51) Int. Cl.
*B05D 3/12* (2006.01)

(52) U.S. Cl. .......... 427/240; 427/425; 118/52; 118/320; 118/326; 438/780; 438/782

(58) Field of Classification Search ................... 427/240, 427/425; 118/52, 320, 326; 438/758, 780, 438/782

See application file for complete search history.

(56) References Cited

U.S. PATENT DOCUMENTS

| | | | |
|---|---|---|---|
| 4,315,705 | A | 2/1982 | Flint |
| 6,247,479 | B1 | 6/2001 | Taniyama et al. |
| 6,589,338 | B1 | 7/2003 | Nakamori et al. |
| 6,715,943 | B2 | 4/2004 | Nagamine |
| 2004/0197433 | A1 | 10/2004 | Terada et al. |

FOREIGN PATENT DOCUMENTS

JP 2002-280296 9/2002

*Primary Examiner* — Kirsten Jolley
(74) *Attorney, Agent, or Firm* — Smith, Gambrell & Russell, LLP

(57) ABSTRACT

A liquid treatment apparatus treating a surface of a substrate held generally horizontally on a stage in a housing by supplying a treating liquid to said surface from a supply nozzle. The liquid treatment apparatus includes a cup body provided so as to surround the substrate held in the substrate holding part laterally, the cup body being mounted detachably to a base inside the housing from an upward direction thereof; a cup body holding part holding the cup body detachably; and an elevating mechanism moving the cup body holding part up and down between a first position at which the cup body is mounted upon the base body and a second position located above the first position.

22 Claims, 12 Drawing Sheets

MAINTENANCE DIRECTION

LIQUID TREATMENT APPARATUS, MOUNTING AND DISMOUNTING METHOD OF A CUP BODY, AND STORAGE MEDIUM

CROSS REFERENCE TO RELATED APPLICATION

This application is a division of Ser. No. 11/907,291, filed Oct. 10, 2007, which is being incorporated in its entirety herein by reference.

BACKGROUND OF THE INVENTION

The present invention relates to the technology of mounting and dismounting a cup body to and from a liquid treatment apparatus that applies a treating liquid, a resist liquid for example, upon a substrate, the substrate may be a semiconductor wafer or a glass substrate (LCD substrate) of liquid crystal display devices.

In a photoresist process, which constitutes one of the semiconductor fabrication process steps, a resist liquid is applied upon a surface of a substrate such as a semiconductor wafer (referred to hereinafter as "wafer"), followed by an exposure process, and a developing process is conducted thereafter by using a developing liquid such that there is formed a mask pattern on the surface of the wafer. Such a process is conducted generally by using a system in which an exposure apparatus is coupled with a coating and developing apparatus that carries out application and developing of a resist.

A spin coating process is one of the liquid treatment processes that applies a coating liquid, which is one of the processing liquids and including a resist liquid, developing liquid, and the like, upon a wafer surface. A brief explanation will be made upon a liquid treatment apparatus 1 that uses this process.

First, a wafer W is held generally horizontally on a spin chuck 11, and a coating liquid supplied from a supply path not illustrated is supplied generally at the central part of the surface of the wafer W by ejecting the coating liquid from a supply nozzle 15 in the state that the supply nozzle 15 is set at a location opposite to the surface of the wafer W.

Further, the wafer W is rotated about a vertical axis, and the coating liquid is spread over the entire surface of the wafer W by the centrifugal force generated as a result of spinning of the wafer W. With this, a coating film is formed on the surface of the wafer W.

Surrounding the spin chuck 11, there is disposed a cylindrical cup body 2 for suppressing scatter of the coating liquid in such a manner that the cup body 2 surrounds the wafer W held upon a spin chuck 11 from a lateral direction. Further, there is formed a flow of the air from a processing space 10a of the liquid treatment apparatus 1 into the interior of the cup body 2, wherein the air thus entered into the cup body 2 is thereafter evacuated to the outside.

With this, the coating liquid that has scattered from the wafer W at the time of the liquid treatment process is evacuated together with the air flow from an evacuation port 25 in the form of a mist. Further, some of the scattered coating liquid is collected inside the cup body and is discharged from a drain port 26 as a drain.

On the other hand, there are cases in which a part of the coating liquid traveling through the cup body 2 causes adhesion, solidification or deposition inside the cup body 2. Thereby, the evacuation path of the mist or drain may be blocked, resulting in degradation of evacuation efficiency of the air flow.

Thus, there is conducted a maintenance work periodically, once in a week, for example, wherein the cup body 2 is dismounted from the liquid treatment apparatus 1 and a substitute cup body 2 is mounted in place thereof.

Patent Reference 1 Japanese Laid-Open Patent Application 2002-280296 Official Gazette

SUMMARY OF THE INVENTION

Meanwhile, the coating and developing apparatus that uses the construction of the liquid treatment apparatus 1 noted above for the resist coating unit, developing unit, or the like, has the construction of having such processing units in plural numbers for improvement of the process efficiency. Further, the coating and developing apparatus is configured to have a stacked construction stacking compact processing units in plural layers for reducing the footprint of the coating and developing apparatus. In addition, there is a tendency, with increase of the diameter of the wafer W to be processed, in that the size of the cup body 2 is increasing.

Now, with the liquid treatment apparatus 1 thus provided to the coating and developing apparatus of such a construction, the operator faces a difficulty that the operator has to handle the cup body 2 of heavy weight in a narrow space. When the operator couldn't hold the cup body 2 properly, the cup body 2 may hit the parts such as the spin chuck 11 or supply nozzle 15 and cause serious damages thereto.

Further, as explained with reference to FIG. 1, the cup body 2 of general construction has the evacuation port 25 and the drain port 26 at a bottom surface thereof for ejecting mists or drains of the coating liquid. Thus, there is a need, when to mount a substitute cup body 2 to the liquid treatment apparatus 1, that the operator brings the cup body 2 into a housing 10 of the liquid treatment apparatus 1 and align the foregoing ports 25 and 26 with an evacuation line 51 and a drain line 52 of the liquid treatment apparatus 10. In this state, the operator lowers the cup body 2 and connects the ports 25 and 26 to the lines 51 and 52.

Further, at the time of dismounting the cup body 2, there is a need for the operator to lift up the cup body 2 and take out from the housing 10 while holding the drain port 26 by hand such that the coating liquid remaining in the cup body 2 is not spilled over.

Such lifting and lowering operations were particularly difficult operations.

In order to ease the problem, Patent Reference 1 discloses a liquid treatment apparatus of the construction in which the cup body 2 and the spin chuck 11 are accommodated into a box-shaped accommodation vessel having an opened top side and the accommodation vessel is drawn out from the housing 10 along the rails provided at an underside of the accommodation vessel.

According to this technology, the operator can work in an opened area by drawing out the accommodation vessel from the housing 2, and the mounting and dismounting operation of the cup body 2 is facilitated. On the other hand, the rails disposed underneath the cup body 2 works against the downsizing of the housing 10. In addition, this technology cannot ease the lifting and lowering operations of the cup body 2, which is the most difficult operation of mounting and dismounting the cup body 2.

The present invention has been made in view of the foregoing circumstances and it is an object of the present invention to provide a liquid treatment apparatus carrying out a liquid treatment by supplying a treatment liquid to a surface of a substrate from a supply nozzle, wherein a mounting and dismounting operation of a cup body to and from the liquid treatment apparatus is eased substantially. Further, the present invention provides a method of mounting and dismounting the cup body as well as a recording medium recorded with the method of mounting and dismounting the cup body.

According to the present invention, there is provided a liquid treatment apparatus treating a surface of a substrate held generally horizontally on a substrate holding part in a housing by supplying a treating liquid to said surface from a supply nozzle, comprising:

a cup body provided so as to surround said substrate held in said substrate holding part laterally, said cup body being mounted detachably to a base inside said housing from an upward direction thereof;

a cup body holding part holding said cup body detachably; and an elevating mechanism moving said cup body holding part up and down between a first position at which said cup body is mounted upon said base body and a second position located above said first position.

Preferably, said cup body holding part is constructed so as to hold the cup body detachably in a lateral direction, and wherein said second position is set at a height enabling to take out said cup body dismounted from said cup body holding part straight via an opening formed on a lateral wall of said housing without causing interference with other parts. Further, said liquid treatment apparatus may further comprise a moving mechanism for causing said cup body holding part to move between said second position and a third position offset from said second position in a lateral direction.

Preferably, said cup body may be assembled by stacking a plurality of ring members, said cup body holding part being constructed to hold said cup body from above and below only in the case said ring members are assembled properly, said cup body holding part including an elastic body for pressing said cup body from upward and downward directions.

Further, said liquid treatment apparatus may comprise: an evacuation port connectable to an evacuation line for evacuating a space inside said cup body; a drain port connectable to a drain line for ejecting a liquid fell inside said cup body; and a restriction member for restricting a position of said cup body in a circumferential direction by restricting at least one position of said evacuation port and said drain port. Preferably, said restriction member restricts a position of at least one of said evacuation port and said drain port when at a restriction position and when mounting said cup body upon said cup body holding part, said restriction member being configured to be moved to an open position when dismounting said cup body from said cup body holding part, said liquid treatment apparatus may further comprise a position sensor detecting that said restriction member has reached said restriction position, a mounting state judging part configured to judge, based upon a detection result of said position sensor, whether or not said cup body is mounted properly upon said cup body holding part, and a notification part configured to notify a result of judgment of said mounting state judging part.

Further, there may be provided a drain port connectable to a drain line configured to drain a liquid that has fallen into said cup body at a bottom surface of said cup body, said cup body holding part may be configured to include a liquid catching mechanism configured to close said drain port disconnected from said drain line.

Further, said liquid treatment apparatus may comprise a detection sensor configured to detect, when lowering said cup body holding part by said elevating mechanism from said second position to said fist location, whether or not said cup body holding part has reached said first position, and a judgment part configured to judge, when said detection sensor did not detect that said cup holding part has reached said first position, that said cup body is not mounted upon said liquid treatment apparatus. Further, it is preferable in this case to provide a notification part configured to notify a result of judgment of said judgment part.

Further, according to the present invention, there is provided a method of mounting and dismounting a cup to and from a liquid treatment apparatus treating a surface of a substrate held generally horizontally on a substrate holding part in a housing by supplying a treating liquid to said surface from a supply nozzle, comprising the steps of:

holding a cup body provided so as to surround said substrate held in said substrate holding part laterally in a manner detachable to and from a cup body holding part, said cup body being mounted detachably to a base inside said housing from an upward direction thereof;

elevating said cup body holding part up and down between a first position at which said cup body is mounted upon said base body and a second position located above said first position.

Preferably, said cup body holding part is constructed so as to hold the cup body detachably in a lateral direction, and wherein said second position is set at a height enabling to take out said cup body dismounted from said cup body holding part straight via an opening provided to a lateral wall of said housing without causing interference with other parts.

Further, said mounting and dismounting method may further comprise a moving step for causing said cup body holding part to move between said second position and a third position offset from said second position in a lateral direction.

Preferably, said cup body is assembled by stacking a plurality of ring members, said cup body holding part being constructed to hold said cup body from above and below only in the case said ring members are assembled properly when in said step of holding said cup body to said cup body holding part, said cup body holding part including an elastic body for pressing said cup body from upward and downward directions.

Preferably, there is provided an evacuation port connectable to an evacuation line evacuating a space inside said cup body and there is provided a drain port connectable to a drain line discharging a liquid that has fallen into said cup body, said evacuation port and said drain port being provided to a bottom surface of said cup body, said step of holding said cup body to said cup body holding part may hold said cup body such that said cup body is positioned with regard to a circumferential direction thereof by restricting a position of at least one of said evacuation port and said drain port by a restriction member provided to said cup body holding part. Preferably, said restriction member restricts a position of at least one of said evacuation port and said drain port when at a restriction position and when mounting said cup body upon said cup body holding part, said restriction member being configured to be moved to an open position when dismounting said cup body from said cup body holding part, said mounting and dismounting method further including the steps of: detecting that said restriction member has reached said restriction position; judging, based upon a detection result of said detection step, whether or not said cup body has been mounted properly upon said cup body holding part; and notifying a result of judgment of said judging step.

In addition, there may be provided a drain port connectable to a drain line ejecting a liquid that has fallen into said cup body at a bottom surface of said cup body, and wherein it may be configured to close said drain port disconnected from said drain line, in said step of moving said cup body holding part up, by a liquid catch mechanism provided to said cup body holding part.

Further, said mounting and dismounting method may include the steps of: detecting, in a step of moving said cup body holding part from said second position to said first position, whether or not said cup body holding part has reached said first position; and judging, when said detection step did not detect that said cup body holding part has reached said first position, that said cup body has not been mounted upon said liquid treatment apparatus. In this case, said mounting and dismounting method may further include the step of notifying a result of judgment of said judgment step with regard to mounting of said cup body.

Further, the present invention provides a recording medium storing a program code used in a liquid treatment apparatus for applying a liquid treatment to a surface of a substrate by supplying thereto a treating liquid from a supply nozzle in a state said substrate is held generally horizontally by a substrate holding part in a housing, the program code including the steps for carrying out the mounting and dismounting method of the cup body noted above.

According to the present invention, there is provided an elevating mechanism moving the cup body to be mounted to the liquid treatment apparatus up and down between a mounting position thereof and a position in which the cup body is brought in and brought out, and thus, there is no longer the need for an operator to carry out these operations. Thereby, the work of the operator for mounting and dismounting the cup body is eased significantly.

BRIEF DESCRIPTION OF THE DRAWINGS

FIG. 2A is a diagram showing the liquid treatment apparatus of FIG. 1 in a plan view, while

DETAILED DESCRIPTION OF THE PREFERRED EMBODIMENTS

Figure 1:
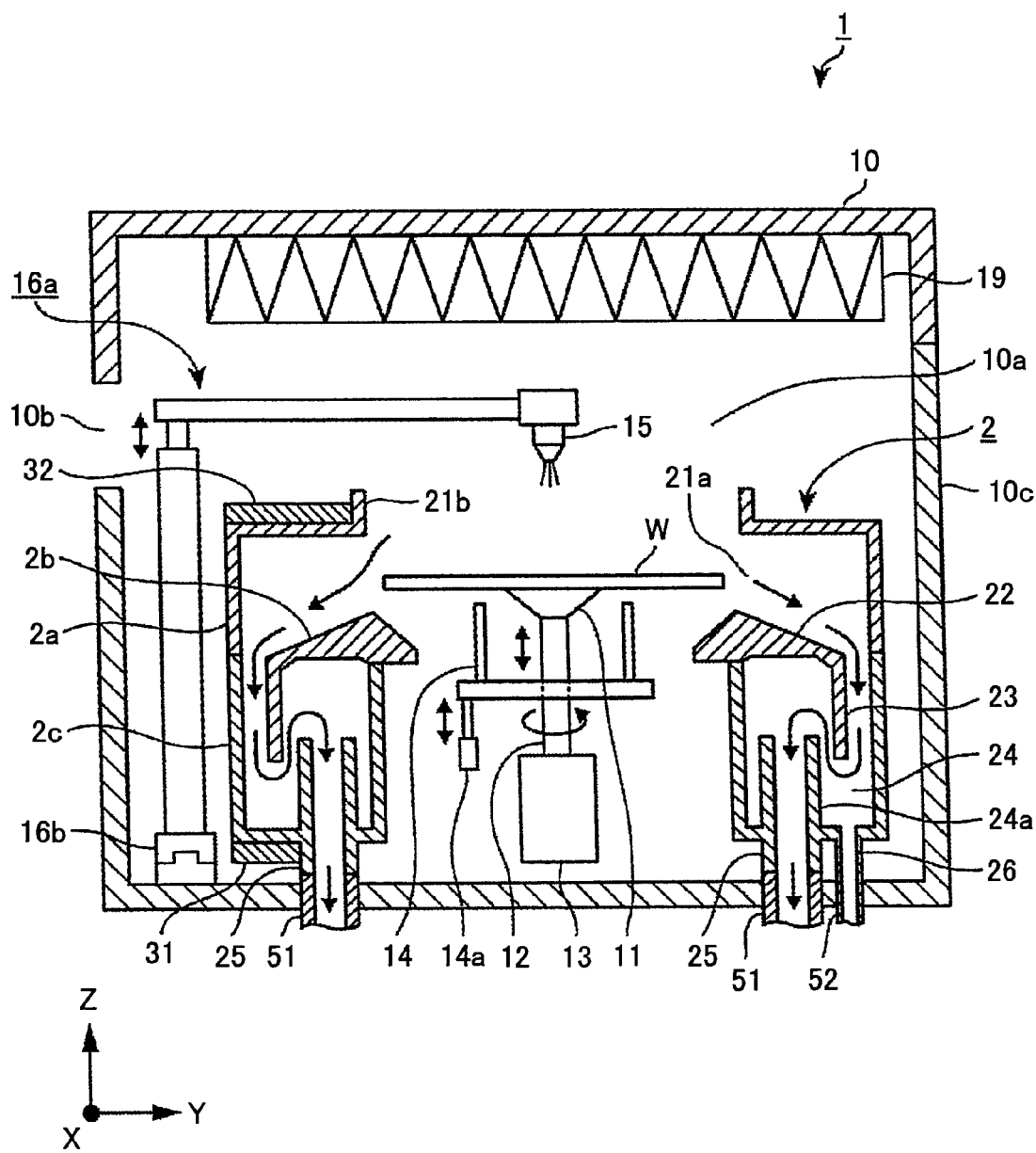
FIG. 1 is a longitudinal cross-sectional view of a liquid treatment apparatus according to a first embodiment of the present invention.
Figure 2A:
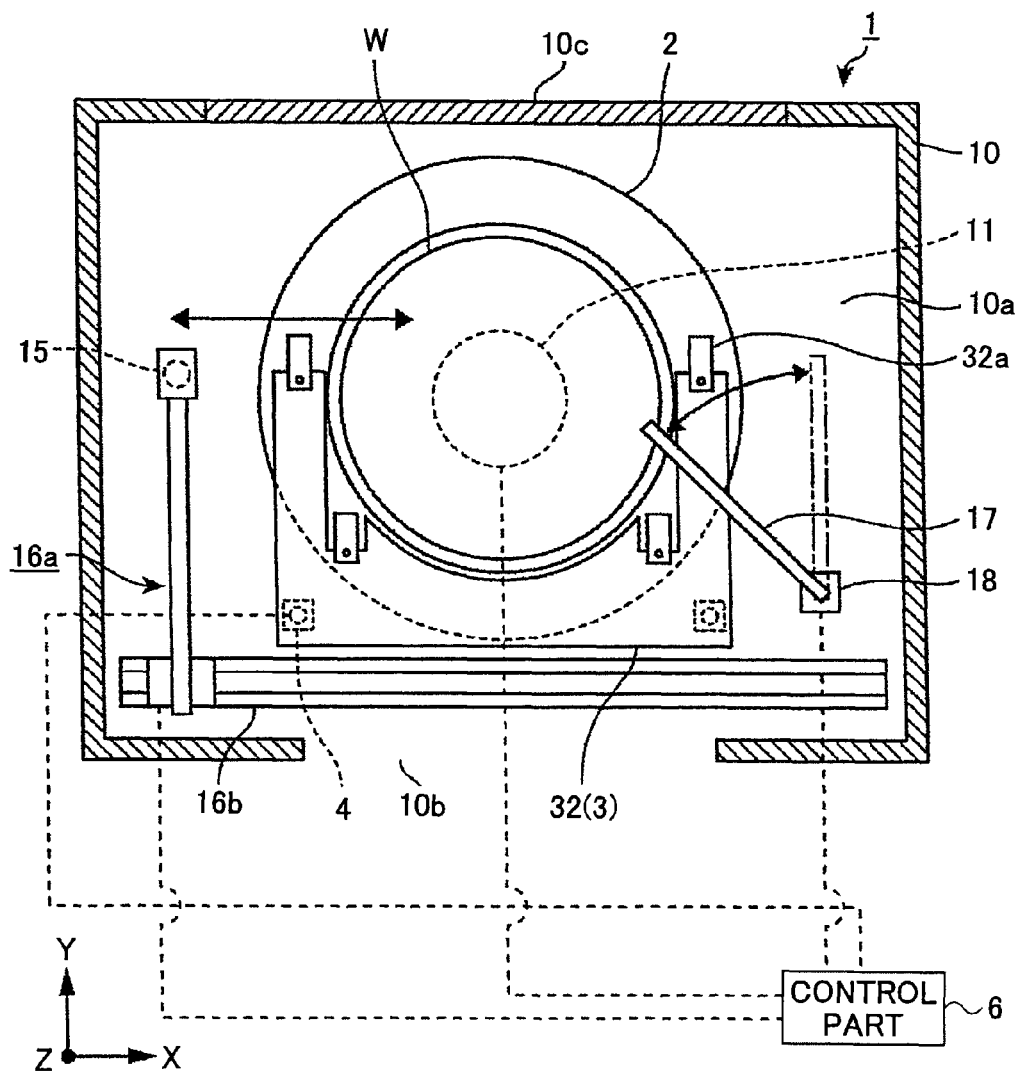

Hereinafter, a first embodiment of the present invention will be explained. In the first embodiment, a liquid treatment apparatus of the present invention is applied to a coating unit that applies a resist liquid upon a wafer W as a coating liquid by way of a spin coating process. First, the outline of a liquid treatment apparatus 1 will be explained with reference to FIG. 1 and FIG. 2A. FIG. 1 is a longitudinal cross-sectional diagram of the liquid treatment apparatus 1 according to the first embodiment, while FIG. 2A is a plan view diagram thereof.

The liquid treatment apparatus 1 has a housing 10 of a rectangular shape, for example, wherein the housing 10 defines therein a processing space 10a where the liquid treatment is brought out. The liquid treatment apparatus 1 includes a spin chuck 11 on which a wafer W to be processed is placed, a supply nozzle 15 supplying a resist liquid to the surface of the wafer W, a rinse nozzle 17 for removing the resist liquid applied to a peripheral part of the wafer W, and a cup body 2 for suppressing scattering of the resist liquid from the surface of the wafer W in the form of mist, or the like.

The spin chuck 11 functions as a substrate support part holding the wafer W generally horizontally by causing suction to a rear surface of the wafer W at a central part thereof. The spin chuck 11 is connected to a drive mechanism (spin chuck motor) 13 via a shaft part 12, wherein the spin chuck 11 is configured rotatable and also movable up and down in the state of holding the wafer W thereon.

At the lateral side of the spin chuck 11, there are provided lifter pins 14 connected to the elevating mechanism 14a in a manner movable up and down in the sate of supporting the rear surface of the wafer W, and with this, it is possible to transfer the wafer W introduced from outside of the housing 10 in cooperation with the transfer means (main arms A1 and A2) to be described later. Here, it should be noted that a numeral 10b in the drawing represents a in/out opening of the wafer W formed at a surface facing the transfer means (main arms A1 and A2).

The supply nozzle 15 performs the function of supplying a resist liquid supplied thereto from a supply unit not illustrated to the surface of the wafer W held on the spin chuck 11. The supply nozzle 15 is supported by a base 16a, wherein the base 16a is movable up and down in a Z-direction shown in FIG. 1 and in an X-direction by a guide rail 16b provided at a base part of the base 16a. As a result of this construction, the supply nozzle 15 moves from a home position (left edge position of the guide rail 16b in FIG. 2A) to a position facing the central part of the surface of the wafer W held by the spin chuck 11, and ejects the resist liquid to the surface of the wafer W.

The rinse nozzle 17 performs the function of supplying a rinse liquid removing the resist film to a peripheral part of the wafer W for preventing peeling of the resist film coated upon the wafer W at the peripheral part thereof. The rinse nozzle 17 has a hook-like inflected shape as shown in the side view of FIG. 2B and is attached to a drive part 18 in an inverted state in a manner movable up and down in a vertical direction and rotatable about a vertical rotational axis.

As shown in FIG. 2A, the rinse nozzle 17 is disposed at an opposite side of the home position of the supply nozzle 15 across the spin chuck 11 and waits ready at the home position thereof shown in FIG. 2A by a broken line in the case wherein the rinse nozzle 17 is not carrying out a side rinse operation.

During the side rinse operation, the drive part 18 is activated and the tip end of the rinse nozzle 17 is moved to a location facing the peripheral edge of the wafer W held by the spin chuck 11.

Further, the liquid treatment apparatus 1 includes a control part 6 performing the role of controlling overall operations of the various parts, wherein a spin chuck motor 13 of the spin chuck 11, a base 16*a*, and the like, are connected to this control part 6. The control part 6 further performs the function of controlling the overall operations of the coating and developing apparatus as a whole, wherein it should be noted that the coating and developing apparatus includes therein the liquid treatment apparatus 1 of the present embodiment as a coating unit.

Next, the cup body 2 will be explained with reference to FIGS. 1 and 2A. The cup body 2 performs the role of suppressing the mist formed at the wafer W at the time of the spin coating process with rotation of the wafer W from scattering into the processing space 10*a* and further the role of discharging the mist or drain to the outside of the liquid treatment apparatus 1.

The cup body 2 is constructed by stacking three ring members as shown in FIG. 1, one being an under cup 2*c* that performs the function of liquid catching part catching the drain of the resist liquid, one being an inner cup 2*b* guiding the drain of the resist liquid to the under cup 2*c*, and an upper cup 2*a* forming an air flow path together with the inner cup 2*b* and functioning also as the cover of the cup body 2, wherein the under cup 2*c*, the inner cup 2*b* and the upper cup 2*a* are stacked in this order and there is formed a cylinder of donuts shape after the under cup 2*c*, the inner cup 2*b* and the upper cup 2*a* are assembled.

Hereinafter, the construction of the cup body after assembling will be explained. As shown in FIG. 1, there is formed an opening 21*a* between the upper cup 2*a* and the inner cup 2*b*. The opening 21*a* performs the role of incorporating the air flow (shown in FIG. 1 by a continues arrow) including the mist of the resist liquid into the flow path formed between the upper cup 2*a* and the inner cup 2*b*.

For example, the cup body 2 is mounted upon the liquid treatment apparatus such that the opening 21*a* is located at the outside of the periphery of the wafer W held by the spin chuck 11 as shown in FIG. 1.

Further, there is provided a ring member 22 having an L-shaped cross-section adjacent to but at the lower level of the periphery of the wafer W held on the spin chuck 11, wherein the ring member 22 is provided with an edge plate 23 at the outer edge thereof such that the edge plate 23 extends in the downward direction and invades into the liquid catching part 24 located at the bottom part of the cup body 2. With this, a part of the resist liquid scattered from the wafer W is guided to the liquid catching part 24 as a drain along the surface of the ring member 22 and the surface of the edge plate 23. It should be noted that the ring member 22 and the edge plate 23 constitute together a part of the inner cup 2*b*.

The lower part of the cup body 2 forms the aforementioned liquid catching part 24 constructed by the under cup 2*c*, wherein there are formed, at a bottom part thereof, a drain port 26 discharging the drain of the resist liquid accumulated in the liquid catching part 24 and two evacuation ports 25 evacuating the air flow passed through the cup body 2. As shown in FIG. 1, the respective ports 25 and 26 are connected to evacuation lines 51 and a drain line 52, and with this, the drain of the resist liquid and the air flow containing therein the mist are discharged from the liquid treatment apparatus 1.

Here, it should be noted that the evacuation port 25 extends in the upward direction in the liquid catching part 24 as shown in FIG. 1 wherein the evacuation port 25 forms an overflow blocking wall 24*a* preventing overflow of the drain from the liquid catching part 24 into the evacuation line 51. Each of the ports 25 and 26 has a shape fit with the evacuation line 51 or the drain line 52, and thus, the ports 25 and 26 are connected with the lines 51 and 52 respectively by way of a fitting engagement, by merely pressing the cup body 2 into the housing 10 after achieving proper alignment.

While the two ports 25 and the port 26 are disposed at the bottom of the cup body 2 to form a triangle (see FIG. 5), FIG. 1 shows these ports 25 and 26 as if they are aligned on a line in FIG. 1 for the sake of convenience of illustration.

Further, there is provided a filter unit 19 at the ceiling part of the housing 10 opposite to the cup body 2, wherein there is formed a down flow of clean air inside the processing space 10*a* by supplying a clean air from the filter unit 19 with a predetermined flow rate.

A part of the clean air is evacuated from an evacuation part not illustrated but provided to the processing space 10*a*, while the remaining clean air is introduced into the cup body 2 from the opening 21*a* and forms an air flow inside the cup body 2 as shown in the cross-sectional diagram of FIG. 1 by an arrow. The clean air is then evacuated from the evacuation port 25. Further, it should be noted that the reference numeral 10*c* represents a lid removed at the time the cup body 2 is brought in and brought out to and from the housing 10.

Based on the foregoing construction, the operation of the liquid treatment conducted with the liquid treatment apparatus 1 will be explained briefly.

First, a wafer W is brought into the processing space 10*a* via the in/out opening 10*b* by means of an external transfer means, wherein the wafer W thus brought in is supported by the lifter pins 14 at the rear side thereof. Thereafter, the transfer means is retracted to the outside of the processing space 10*a* and the wafer W is transferred to the spin chuck 11 by lowering the lifter pins 14. Further, the base 16*a* is moved such that the supply nozzle 15 is located above the central part of the wafer W held by the spin chuck 11, and the resist liquid is ejected in this state.

After the resist liquid has thus fallen upon the surface of the wafer W, the spin chuck 11 is rotated for about 2 seconds for example with the rotational speed of 1000 rpm for example. With this, a spin coating is conducted in which the resist liquid is spread in the radial direction of the wafer W. Subsequently, the spin chuck 11 is rotated for about 30 seconds for example with the rotational speed of 2500 rpm for example, and with this, the wafer is dried by casting off the coated resist liquid.

Thereafter, a rinse liquid is applied to the peripheral part of the wafer W from the rinse nozzle 17, and the resist film coated upon the peripheral part of the wafer W is removed by rotating the spin chuck 11 for 8 seconds for example with the rotational speed of 1500 rpm for example. Further, the spin chuck 11 is rotated for 5 seconds for example with the rotational speed of 2000 rpm for example, and with this, the wafer is dried as a result of casting off of the rinse liquid. With this, the liquid treatment is completed.

The wafer W coated with the resist liquid is then brought out from the liquid treatment apparatus 1 by being transferred with a reverse order to the case of bringing the wafer into the liquid treatment apparatus 1.

As a result of the rotation of the spin chuck 11, the mist scattered from the wafer W is captured by the air stream in the cup body 2 and is discharged to the evacuation line 51 via the evacuation port 25.

Further, the liquid droplets cast off from the wafer W or grown on the wall surface of the air flow path from the mist form a drain, wherein the drain runs along the ring member 22, the edge plate 23, and the like, and is accumulated in the liquid catching part 24. Thereafter, the drain is discharged to the drain line 52 via the drain port 26.

Here, it should be noted that the cup body 2 of the present embodiment is held, as shown in FIGS. 1 and 2A, by a cup body holding part formed of a support member 31 supporting the lower surface of the cup body 2 and a holding member 32 holding the upper surface of the cup body 2. Further, the cup body 2 is movable between the mounting position (first position) and a position (second position) at which the operator carries out the bringing in and bringing out operation of the cup body 2 to and from the liquid treatment apparatus 1, by moving the cup holding part up and down at the time of the periodical cleaning process explained in relation to the background of the invention.

Hereinafter, the cup holding part and the elevating mechanism thereof will be described in detail with reference to FIGS. 3-5.

Figure 3:
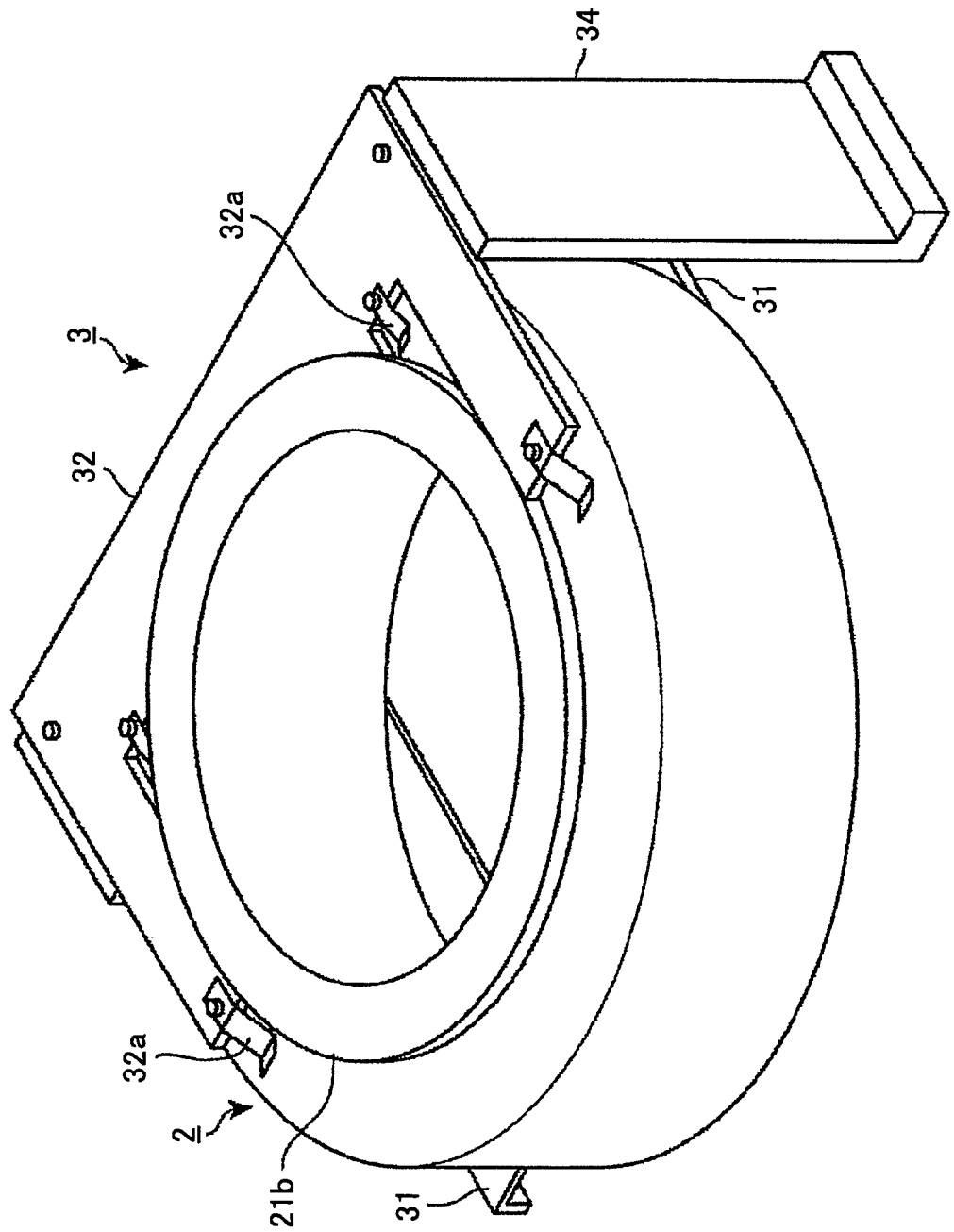
FIG. 3 is a diagram showing a cup holding part and an elevating mechanism thereof in an oblique view for the state the cup holding part holds a cup thereon.
Figure 4:
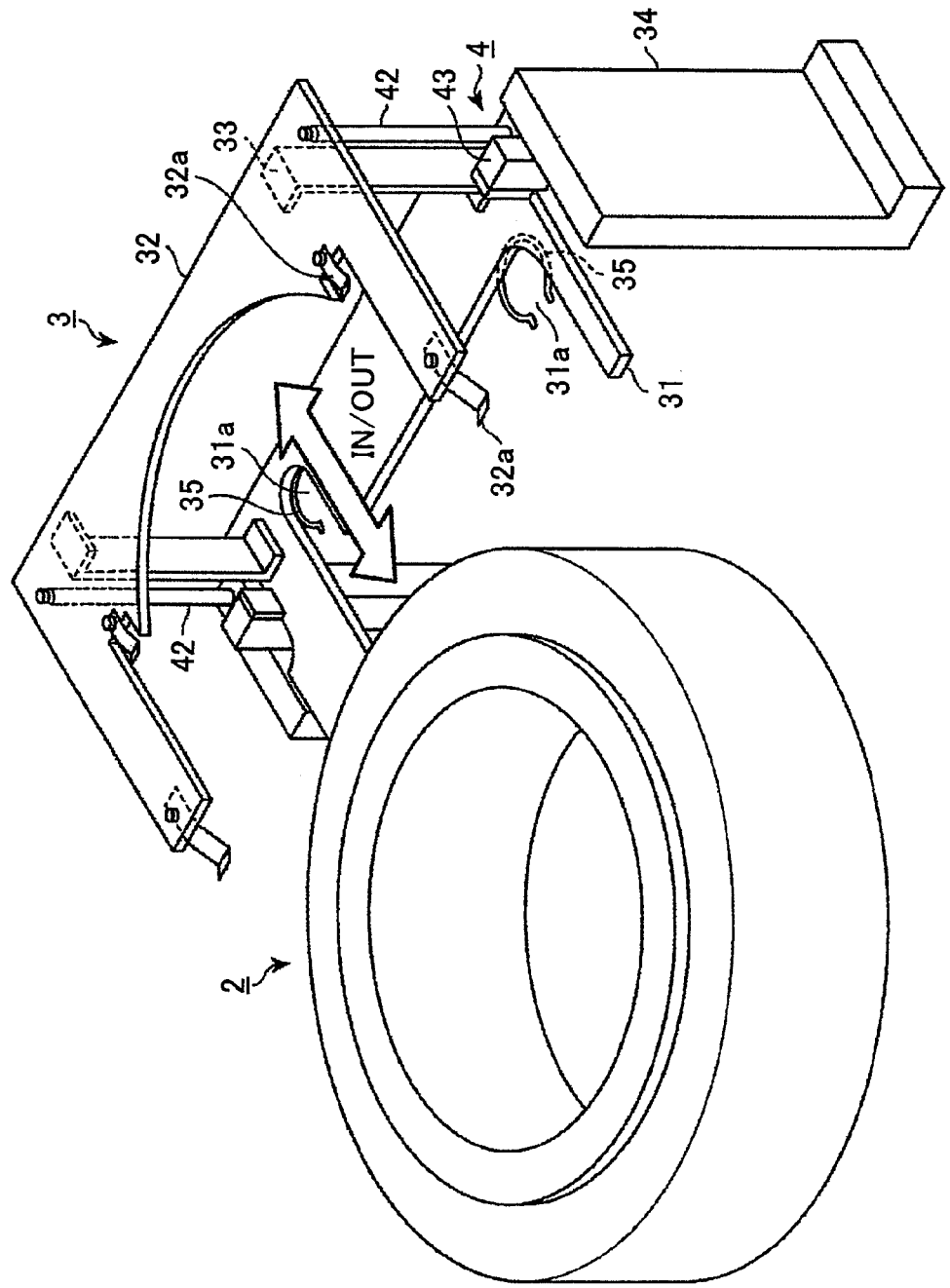
FIG. 4 is a diagram showing the carrying in and carrying out of the cup body in the state dismounted from the cup holding part in an oblique view.

FIG. 3 is an oblique view diagram showing the cup body 2 in the state the cup body 2 is mounted upon the cup body holding part 3, while FIG. 4 is an oblique view diagram showing the cup body 2 in the state the cup body 2 is dismounted from the cup body holding part 3 in correspondence to bringing in or bringing out of the cup body 2. Further, FIG. 5 is an oblique view diagram showing the cup body holding part 3 as viewed from the bottom side thereof in the state the cup body 2 is mounted thereupon.

Figure 2B:
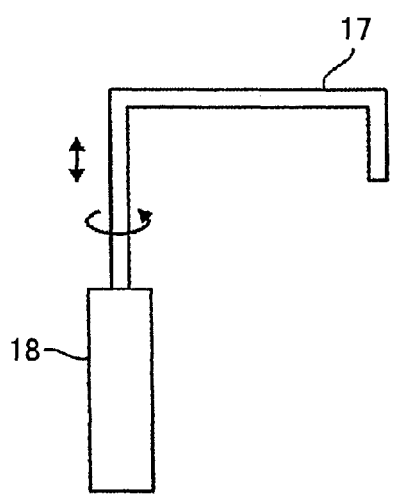
FIG. 2B is a diagram showing a component used therein in a side view.

For the sake of convenience of illustration, the construction of the cup body explained already with reference to FIGS. 1 and 2A, 2B, is simplified in the illustration of FIG. 3 or later.

Referring to FIGS. 3 and 4, the cup body holding part 3 comprises the support member 31 supporting the bottom surface of the cup body 2, the holding member 32 holding the top surface of the cup body 2 from the opposite direction, and the connection member 33 connecting the support member 31 and the holding member 32, wherein the cup body 2 is held by the members 31 and 32.

Each of the support member 31 and the holding member 32 is formed of a plate member having a plan view shape of generally U-shaped form characterized by extension parts formed at the left side and right side thereof so as to extend toward the outside of the coating and developing apparatus, wherein these extension parts are used to hold the cup body 2 from the upward direction and from the downward direction.

In the support member 31, there is formed a port catching part 31a at the proximity end of each of the extension parts in the form of a cutout such that the inner edge of the cutout corresponds to the outer peripheral surface of the evacuation port 25 or the drain port 26. Further, as shown in FIG. 5, there are provided spring members 35 acting as a restricting member in the form of an elastic body, wherein each of the spring members 35 has an arc-shaped part of the form corresponding to the outer peripheral surface of the ports 25 and 26. The spring members 35 are provided right underneath the respective port catching parts 31a in the state that the spring member 35 goes slightly beyond the port catching part 31a and in an urged sate so as to press the ports 25 and 26 from the lateral direction thereof.

Thus, when the cup body 2 is pressed horizontally in the state that the ports 25 and 26 are aligned with the respective spring members 35, the spring members 35 undergo deformation to guide the circumferential surface of the respective ports 25 and 26 and the respective ports 25 and 26 are engaged with the respective arc-shaped parts of the spring members 35. Further, the two spring members 35 squeeze the respective ports 25 and 26 upon recovery of the original state, and with this, the position of the ports 25 and 26 are restricted. With this, the cup body 2 is positioned properly in the circumferential direction.

The holding member 32 is a plate member performing the function of fixing the cup body 2 placed upon the support member 21 by holding the cup body 2 from the upward direction. As shown in FIGS. 3 and 4, the holding member 32 has an arc edge part at the distal end thereof with a curvature corresponding to the curvature of the top edge of the cup body 2 defining an opening. Thereby, the rising edge 21b of the cup body 2 formed along the foregoing top edge thereof so as to define the opening is restricted by being engaged with the arc edge part. Further, as noted above, the respective ports 25 and 26 at the bottom surface of the cup body 2 are restricted by being engaged with the corresponding arc parts of the spring members 2, and with this, the cup body 2 is positioned properly that the respective ports 25 and 26 of the cup body 2 engage with the corresponding evacuation lines 51 and the drain line 52 when the cup body 2 is lowered in this state.

The holding member 32 is provided with four leaf springs 32a, wherein each of the leaf springs 32a serves for an elastic body urged in the manner to press down the top surface of the cup body 2 in the downward direction. With this, the cup body 2 placed upon the holding member 31 is fixed thereto securely. Thereby, it should be noted that the urging amount is adjusted with these leaf springs 32a that, when any of the upper cup 2a, the inner cup 2b, or the like, is not properly assembled to the cup body 2, it is not possible to fix the cup body with the leaf springs 32a and that it is not possible to hold the cup body to upon the cup body holding part 3.

It should be noted that the support member 31 and the holding member 32 are connected with each other by connection members 33 at the left edge and the right edge thereof when viewed from the direction shown in FIG. 4 by an arrow (referred to hereinafter as "maintenance direction") in which the cup body 2 is brought in and brought out. Thereby, the two members 31 and 32 connected with each other by the two connection members 33 face with each other in a generally parallel state and hold the cup 2 therebetween.

The interval of the support member 31 and the holding member 32 facing with each other is determined such that the cup body 2 is held stably only when all of the predetermined three members, such as the upper cup 2a, the inner cup 2b and the under cup 2c, are properly assembled. Thus, in the case the upper cup 2a has inadvertently not assembled, the height of the cup body 2 becomes smaller than the interval between the support member 31 and the holding member 32, and it is no longer possible to hold the cup body 2 by the leaf spring 32a. In such a case, therefore, it is not possible to hold the cup body 2 stably.

Further, as shown in FIG. 1, the cup body 2 has a rectangular lateral shape when viewed from a lateral direction as shown in FIG. 1 and is suitable for fixing with the cup body holding part 3 having a U-shaped lateral shape when viewed also from a lateral direction. It should be noted that the connection member 33 is mounted such that the connection member 33 does not cause interference with the cup body 2 in the state held by the support member 31 and the holding member 32.

The support member 31 and the holding member 32 are fixed upon the two fixing members via a motor cylinder 4 and elevation guide member 43 to be described later, wherein the entire cup body holding part 3 is fixed upon the liquid processing apparatus 1 (base) by fixing the fixing member 34 upon the bottom surface of the housing 10 by using screws. As shown in FIG. 2, the cup body holding part 3 is fixed upon the liquid treatment apparatus 1 in such a manner to hold the cup body 2 against the direction in which the cup body 2 is brought in and brought out (maintenance direction) by the operator in the state the lid 10c is removed.

Next, the elevating mechanism that moves the cup body holding part 3 up and down will be explained. The elevating mechanism moving the cup holding body 3 up and down comprises an elevation guide member 43 guiding the up down movement of the cup body holding part 3 and the motor cylinder mechanism 4 (referred to hereinafter as "motor cylinder 4") that causes the cup body holding part 3 to move up and down.

As shown in FIG. 4, the elevation guide member 43 is provided in a pair, wherein each of the guide members 43 is provided between the support member 31 and the fixing member 34.

Figure 7A:
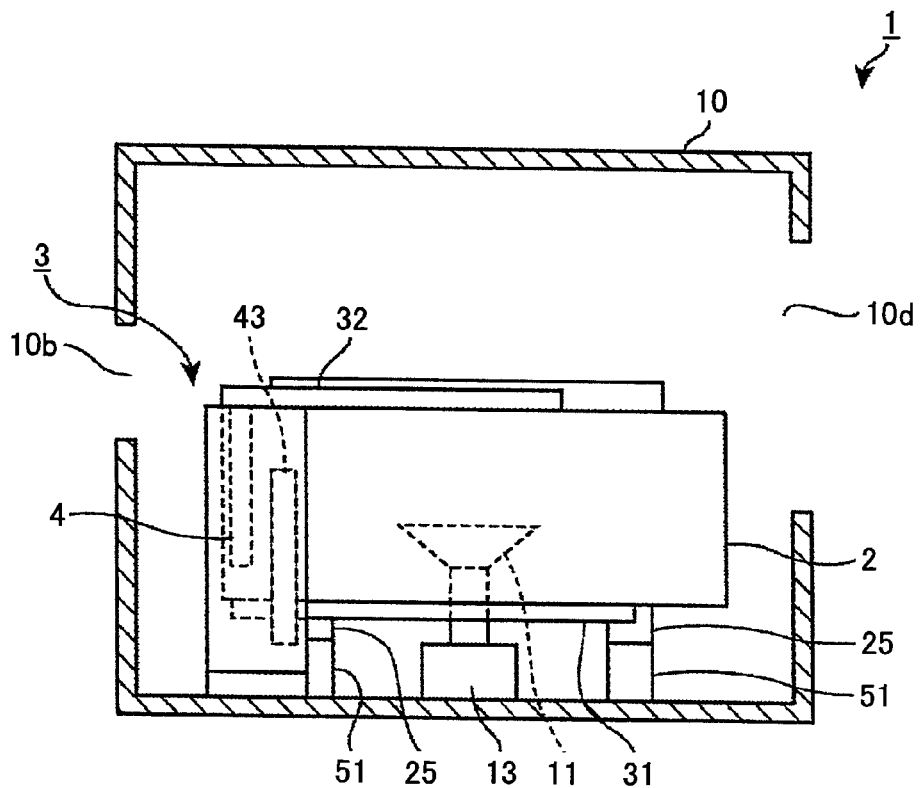
FIGS. 7A and 7B are diagrams explaining the operation of the liquid treatment apparatus according to a first embodiment of the present invention in a side view.
Figure 7B:
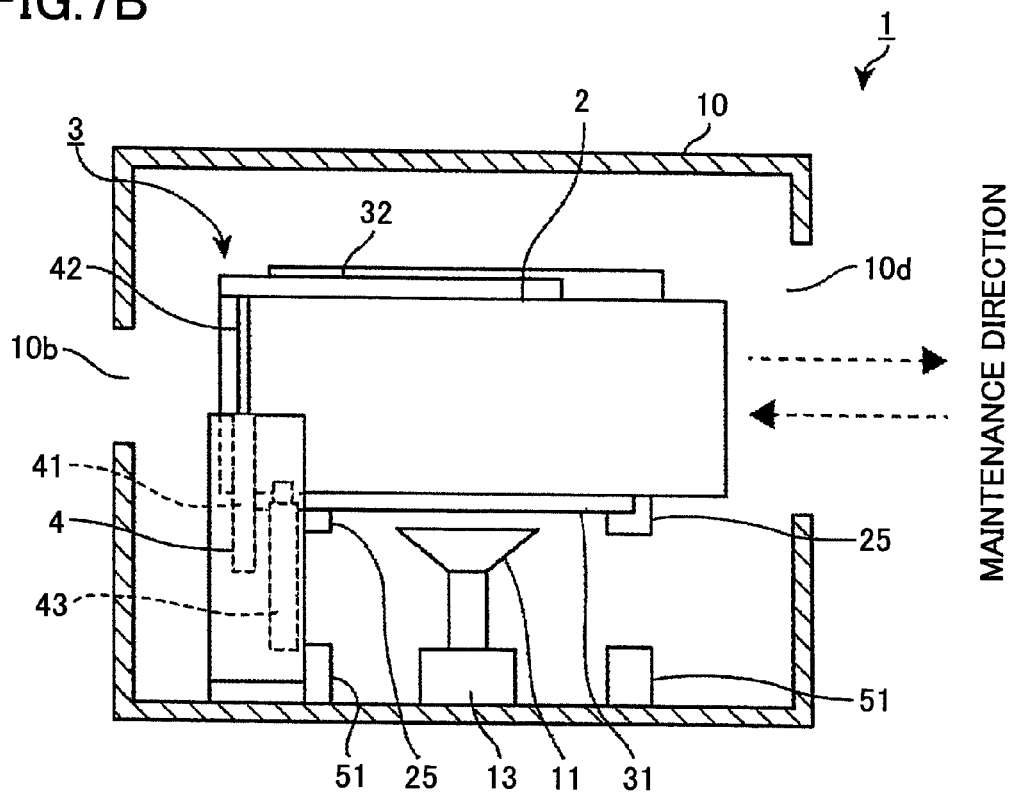

As shown in FIG. 7B to be explained later, the motor cylinder comprises a cylinder rod 42 of a rod shape and a housing 41 provided with a motor, wherein the motor causes the cylinder rod 42 to move back and forth in the axial direction thereof. Thereby, the motor cylinder 4 performs the function of an actuator moving the cup body holding pat 3 up and down by using the electric power from a power supply not illustrated. The motor cylinder 4 is disposed for example at one side of the fixing member 34 (near side in the illustration of FIG. 4 in the present embodiment) such that the moving direction of the already existing elevation guide member 43 becomes parallel to the moving direction of the cylinder rod 42.

Further, there is disposed another cylinder rod 42 following the movement of the motor cylinder 4 and a corresponding housing 41 accommodating this cylinder rod 42. Each of the cylinder rods 42 has a head part fixed upon the bottom surface of the holding member 32 and is extended and retracted from and to the housing 41 with the back and forth movement thereof caused by the motor of the motor cylinder 4. Thereby, the holding member 32 is pushed up or pulled down, and with this, the entire cup body holding part 3 is moved up and down.

Thereby, the length and stroke of the cylinder rod 42 are set such that the cup body holding part 3 is located at the first position in which the cup body 2 is held at the mounting position in the state the cylinder rod 42 is retracted into the housing 41 and such that the cup body holding part 3 is located at the second position in which the cup body 2 is capable of being brought in and brought out in the state the cylinder rod 42 is fully extended from the housing 41.

Further, in the present embodiment, it should be noted that the "second position" is set to the position enabling bringing in and bringing out of the cup 2 without causing interference with other components in the processing space 10a (such as spin chuck 11, and the like).

Further, the control part 6 described before is connected also to the motor cylinder 4 as shown in FIG. 2, wherein it is possible for the control part 6 to control the up and down movement of the cup body holding part 3 or detecting this up and down movement and notify the result of detection to the operator.

Figure 6:
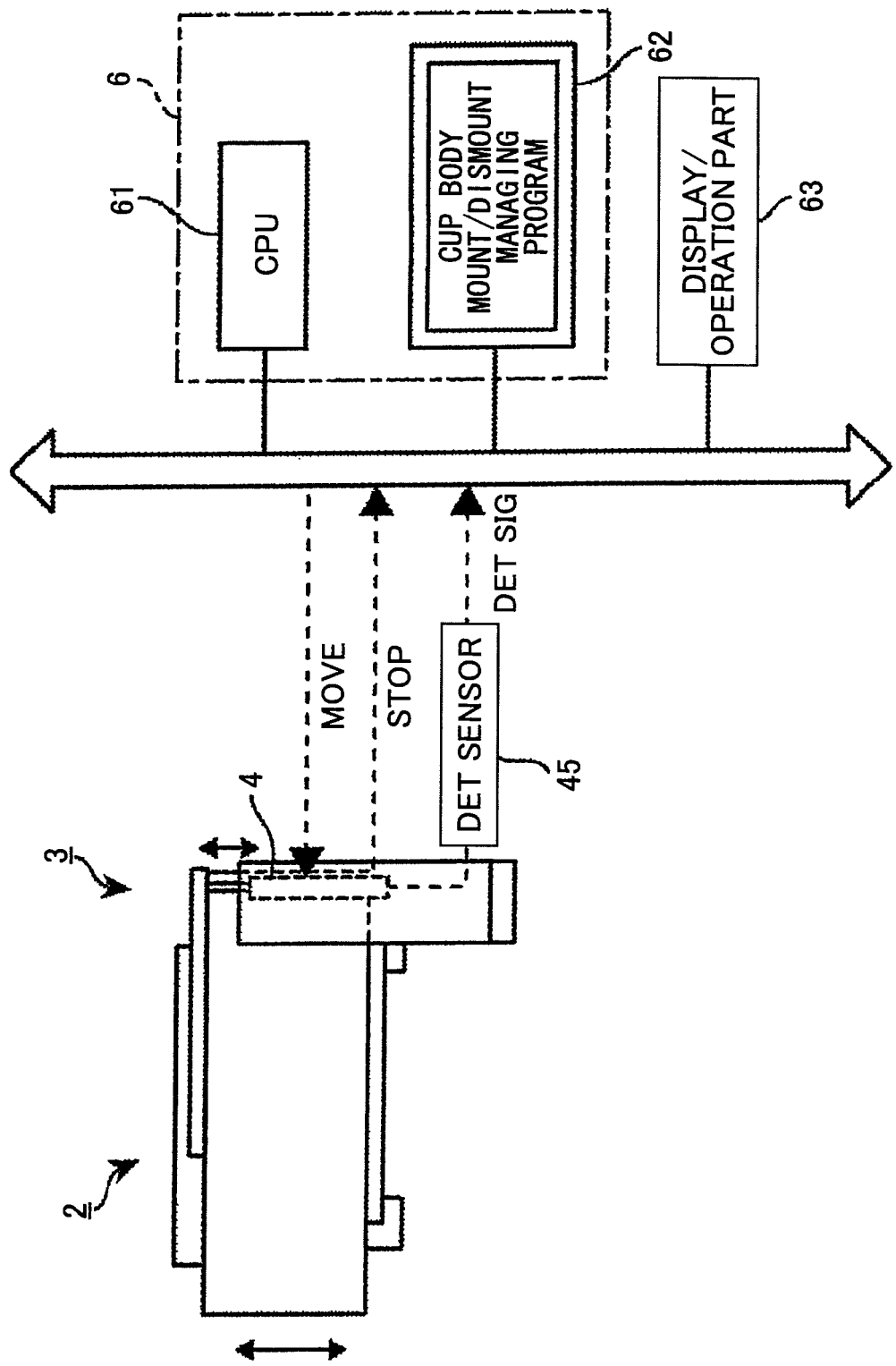
FIG. 6 is a block diagram showing the electric construction of the elevating mechanism and a control part thereof.

FIG. 6 is a block diagram for explaining the electric relationship between the control part 6 and the elevating mechanism of the cup body holding part 3 with regard to the foregoing operations.

Referring to FIG. 6, the control part 6 is formed of a computer having the function of controlling the overall operation of the coating and developing apparatus including the liquid treatment apparatus 1 (coating unit) used therein. Thus, the control part 6 includes a central processing unit (CPU) 61 and a program storage part 62.

In relation to the function of mounting and dismounting of the cup body 2, the motor cylinder 4 is connected to the control part 6 and a move command is issued from the control part 6 to the motor cylinder 4 for starting the operation of causing the cup body holding part 3 to move up and down. On the other hand, the motor cylinder 4 issues a stop signal to the control part 6 indicating that the up/down movement is stopped.

Further, the motor cylinder includes a detector sensor 45, wherein the detection sensor 45 causes turning on when the cylinder rod 42 is fully retracted into the housing 41 and issues a detection signal to the control part 6 notifying that the cup body 3 has reached the first position.

Further, the program storage part 62 performs the function of storing a computer program (indicated as "cup body mount/dismount managing program") that includes the steps of moving the cup body holding part 3 up and down by driving the motor cylinder 4 and further executing the operations as a judging part that judges whether or not the cup body 2 has been mounted upon the liquid treatment apparatus 1 based on the signal from the detection signal from the detection sensor 45 provided to the cylinder 4.

It should be noted that the program storage unit 62 is formed of storage means such as a hard disk drive, a compact disk drive, a magneto-optical disk device, a memory card, and the like.

Hereinafter, the operation of the judging part judging whether or not the cup body 2 has been mounted upon the liquid treatment apparatus 1 will be explained.

The judging part issues the move command to the motor cylinder 4 from the control part 6 and judges thereafter that the cup body holding part 3 has reached the first position and stopped in the case a stop signal is received from the motor cylinder 4 and a detection signal is received from the detection sensor 45 at the same time.

On the other hand, in the case the stop signal has been received from the motor cylinder 4 but the detection signal was not received from the detection sensor, this means that the cup body holding part 3 is stopped before reaching the first position, and it is judged that proper mounting of the cup body upon the liquid treatment apparatus 1 has failed.

Further, the control part 6 is connected to the display/operation part 63, and the display/operation part performs the function of notification means notifying that proper mounting of the cup body 2 has failed based upon the result of the judgment acquired from the judging part (control part 6). Further, it should be noted that the display/operation part 63 also has the function of accepting commands from the operator by way of a software switch.

Next, the function of the present embodiment will be described.

FIGS. 7A and 7B are schematic side view diagrams for explaining the state inside the processing space 10a before and after up and down movement of the cup body holding part 3. FIG. 7A shows the state in which the cup body 2 is mounted upon the liquid treatment apparatus 1, while FIG. 7B shows the cup body 2 in the state capable of being brought in and brought out to and from the housing 10. In these drawings, it should be noted that description of the lifter pins 14, the supply nozzle 15, the filter unit 19, and the like, is omitted for the sake of simplicity of illustration. Further, for the sake of simplicity of illustration, the motor cylinder 4 is indicated to be provided at the opposite side to the case explained in FIG. 3, and thus, at the near side in the illustration of FIGS. 7A and 7B.

The mounting and dismounting operation of the cup body 2 to and from the liquid treatment apparatus 1 is conducted during the interval in which the liquid treatment apparatus 1 of the present invention is not operating, such as the interval in which the coating and developing apparatus equipped with the coating unit is not in operation. In the state before bringing the cup body 2 out of the liquid treatment apparatus, the cup holding part 3 holds the cup 2 at the first location. In this sate, the evacuation port 25 and the evacuation line 51 is connected, and the drain port not illustrated is connected also to the drain line 52. With this, the cup body 2 is in the state mounted upon the liquid treatment apparatus 1.

Next, in order to clean the cup body 2, there is secured a cup body in/out opening 10*d* for bringing the cup body 2 out of the liquid treatment apparatus, by removing the lid 10*c* shown in FIG. 2. Further, the cup holding part 3 is moved up to the second position by the motor cylinder, and thus, the cup body 2 is lifted up as shown in FIG. 7B.

With this, it becomes possible to take out the cup body 2 without causing any interference with other devices inside the processing space 10*a* such as the spin chuck 11, by merely pulling out the cup body 2 in the maintenance direction. Here, it is also possible to construct, in order to avoid interference of the cup body 2 with the spin chuck 11, to lower the spin chuck 11 waiting ready at the transport location of the wafer W by way of the spin chuck motor 13.

Next, the operator introduces a cleaned cup body 2 in place of the cup body 2 thus taken out for the purpose of cleaning, into the processing space 10*a* from the maintenance direction. Thereby, the cup body 2 is held by the cup body holding part 3. In this process, it should be noted that the cup body 2 is positioned precisely and properly as a result of the action of the spring members 35 that holds the two evacuation ports 25 laterally as shown in FIG. 5 and as a result of the rising edge 21*b* being restricted laterally.

Figure 5:
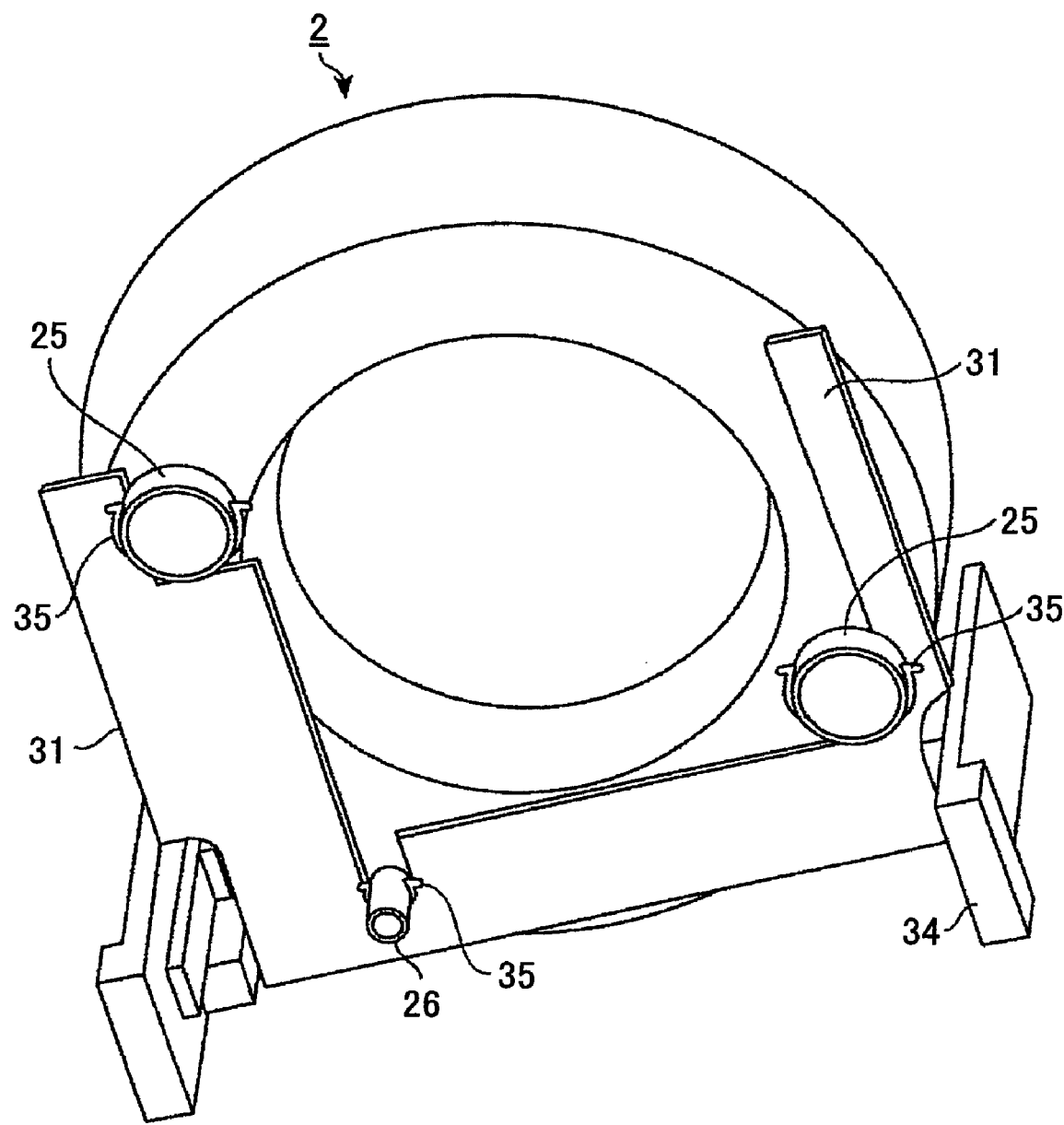
FIG. 5 is a diagram showing the cup body held by the holding part in an oblique view as viewed from a bottom side.

Meanwhile, in the construction of FIG. 5, it is also possible to fix the evacuation ports 35 by the spring members 35 when the cup body 2 is rotated by 180°. In this state, however, it is not possible to connect the drain port 26 with the drain line 52.

Thus, in order to avoid such wrong mounting of the cup body 2, there may be provided an additional restriction mechanism preventing lowering of the cup body 3 to the first position in the case the cup body 2 is mounted with wrong orientation. For example, the restriction mechanism may be provided in the form of a rectangular projection provided at the bottom surface of the housing 10 at such a location that the rectangular projection comes right underneath the drain port 26 in the case the cup body 26 is mounted with a wrong orientation. With such a construction, the projection causes interference with the drain port 26 in the event the cup body 2 is mounted with a wrong orientation and it becomes no longer possible to lower the cup body 2 to the mounting position.

When the cup body 2 is held by the cup body holding part 3, the operator presses a predetermined software switch on the display/operation part 63 to activate the motor cylinder 4. With this, the cup body holding part 3 is lowered to the first position, and with this, the new cup body 2 is mounted upon the liquid treatment apparatus 1 as shown in FIG. 7A. In this case, it is possible to judge whether or not the cup body 2 is properly mounted upon the liquid treatment apparatus 1 by acquiring the stop signal from the motor cylinder 4 and the detection signal from the detector sensor 45.

On the other hand, in the case the stop signal is acquired from the motor cylinder 4 without acquiring the detection signal from the detection sensor 45, it is judged that the mounting of the cup body 2 has failed and the judgment is notified to the operator in the form of display on the display operation part 63. After the mounting of the cup body 2, the operator attaches the lid 10*c*, and with this, the liquid treatment apparatus is ready for use.

According the present invention, the following advantageous effects are attained. Because the liquid treatment apparatus 1 has the cup body holding part 3 that causes the cup body 2 to move up and down between the mounting position thereof and the position in which the cup body is brought in and brought out, without causing interference with other devices in the liquid treatment apparatus 1, there is no longer the need for the operator to hold the cup body 2 by using the hands and move the cup body 2 up and down.

Conventionally, it should be noted that the operator had to bring in the cup body 2 into the housing 10, at the time of introducing the cup body 2, by using the hands and to lower the cup body 2 through the narrow space between the devise such as the spin chuck 11, or the like, and the wall of the housing 10. Further, the operator had to align the evacuation port 25 with the evacuation line 2 by relying upon the sense of the finger tip and mount the cup body while maintaining the alignment. Further, in order to confirm the state of the finger tip, the operator had to peer into the housing 2 while holding the cup body 2 by the hands, and thus, the operator had to take unnatural body position.

Contrary to the foregoing, the embodiment of the present invention eliminates the need of the operator to do the work of moving the cup body 2 up and down. Only what is required for the operator is to slid the cup body 2 in the horizontal direction and mount the cup body upon the cup body holding part 3. Thereby, the need of doing the difficult work as explained before is eliminated, and the work load of the operator is reduced significantly.

Further, the cup holding part 3 is configured such that the cup body 2 is held stably between the support member 31 and the holding member 32 only in the case the cup body 2 is properly assembled by the predetermined members such as the upper cup 2*a*, the inner cup 2*b*, and the like.

Thus, with the cup body 2 in which the assembling of the upper cup 2*a* is inadvertently omitted, for example, the cup body holding part 3 cannot hold such a cup body, and thus, it is possible with the present invention to positively prevent any inadvertent omission of one or more parts in the cup body 2 formed by assembling a plurality of components.

Further, because the support member 31 of the cup body holding part 3 that holds the cup body 2 thereon is provided with the restriction components such as the port catching part 31*a* restricting the position of the two evacuation ports in the circumferential direction, the spring members 35, and the like, any movement of the cup body 2 held with proper orientation in the circumferential direction is prevented, and it becomes possible to connect the evacuation ports 25 and the drain port 26 with the evacuation lines 51 or the drain line 52 with excellent precision.

Further, while the present embodiment has been explained for the construction of fixing two evacuation ports 25, it should be noted that the combination of the ports 25 and 26 to be fixed is not limited to this specific example. It is sufficient to fix any one, or more, of the evacuation ports 25 and the drain port 26 of the cup body 2 held with the proper orientation.

Further, the liquid treatment apparatus 1 is provided with the detection sensor 45 for detecting that the cup body holding part 3 has reached the first position, and the judging part (which is one of the functions of the control part 6) judging whether or not the cup body 2 has been properly mounted upon the liquid treatment apparatus 1 based upon the result of detection of the detection sensor 45.

As a result, it is possible, in the event that mounting of the cup body 2 upon the liquid treatment apparatus 1 has failed because of the reason that the cup body 2 has not been mounted in the proper orientation, or the like, to detect that mounting of the cup body 2 upon the liquid treatment apparatus 1 has failed, and notification is made to the operator about the situation by way of the display and operation part 63 serving for the notification means.

With this, the operator can take an appropriate action, and the problems such as staring the operation of the liquid treatment apparatus 1 without mounting the cup body 2 are prevented.

Figure 8:
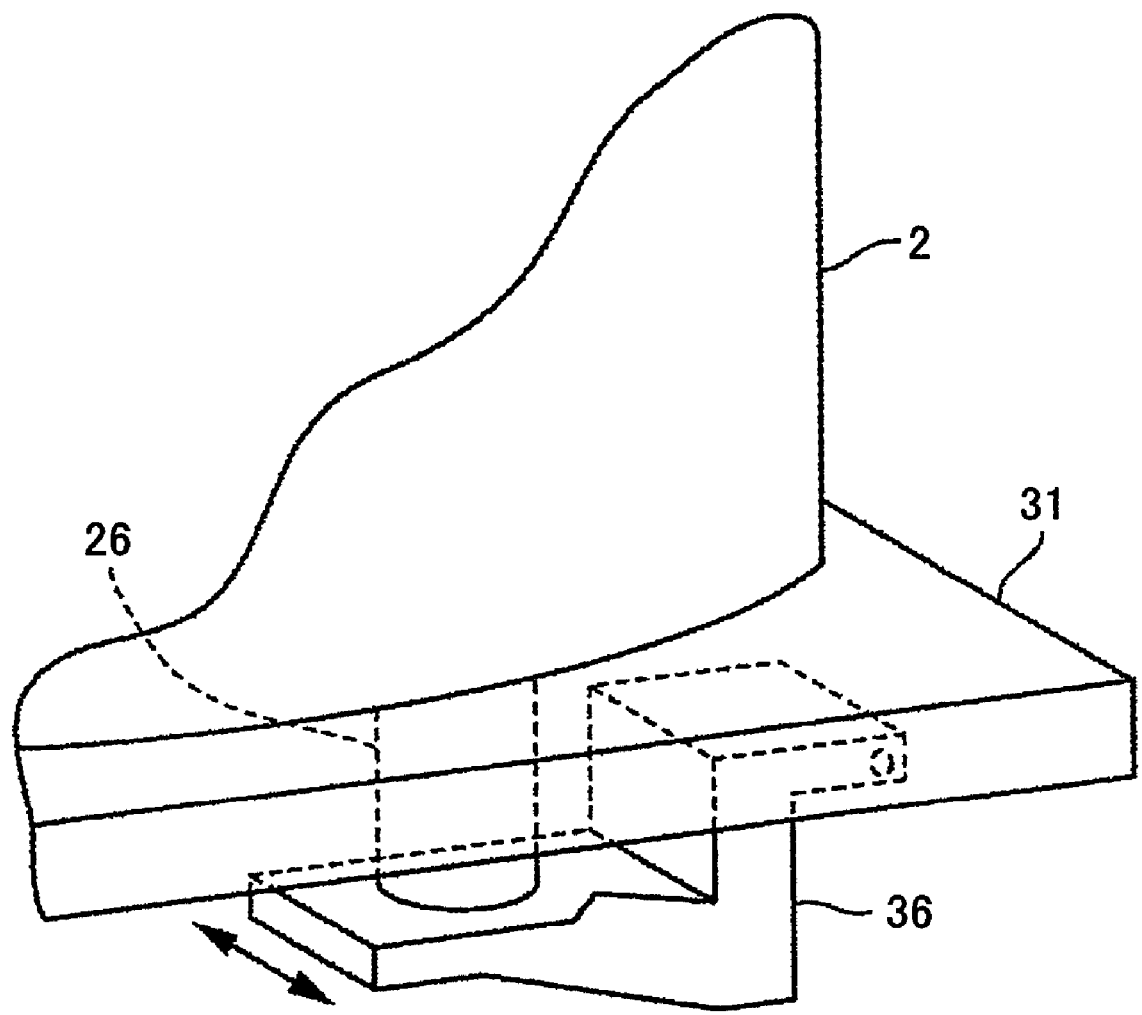
FIG. 8 is a diagram showing a liquid catching mechanism that catches a leaked drain liquid when the cup body is lifted up in an oblique view.

Further, as shown in the enlarged oblique view diagram of FIG. 8, there may be provided a liquid catching mechanism 36 for catching leakage of the resist liquid accumulated in the under cup 2c from the drain port 26 at the time of the upward movement of the cup body 2.

The liquid catching mechanism 36 may be constructed such that the liquid catching mechanism 36 is slid to the location right underneath the drain port 26 from a retracted position, which is offset from the path of the drain port 26, when the cup body holding part 3 is moved up and such that the liquid catching mechanism 36 is slid to the foregoing retracted position from the location right underneath the drain port at the time of lowering the cup body holding part 3 such that the liquid catching mechanism 36 does not obstruct the connection of the drain port 26 and the drain line 52 at the time of mounting the cup body 2.

Further, the cup body holding part 3 is not limited to the type that holds the cup body with the support member 31 and the holding member 32 as explained in the foregoing embodiment. For example, it is possible that the cup body holding part 3 may be of the type that lacks the holding member 32 and holds the cup body only by the shape of the bottom surface of the cup body 2 and the support member 31 having generally the same shape.

While the liquid treatment apparatus 1 has been explained with the foregoing embodiment for the construction having the elevating mechanism that causes the cup body 2 to move up and down, the liquid treatment apparatus 1 may further include moving means for moving the cup body 2 horizontally in the direction of bringing in and bringing out the cup body 2 in addition to such an elevating mechanism.

Figure 9A:
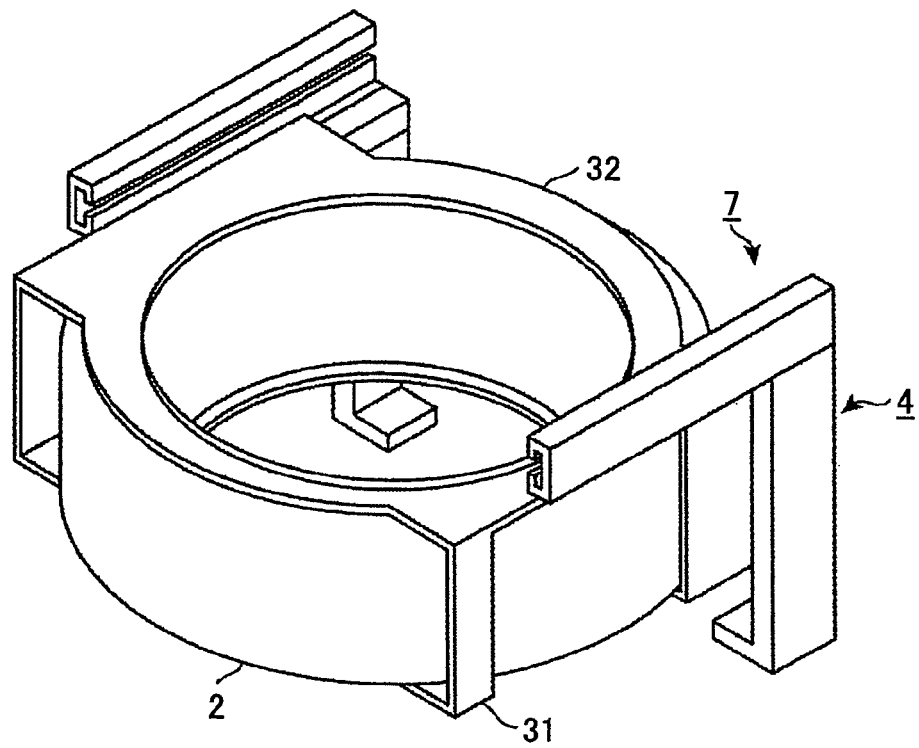
FIGS. 9A and 9B are diagrams showing the operation of the liquid treatment apparatus according to a second embodiment of the present invention in an oblique view.
Figure 9B:
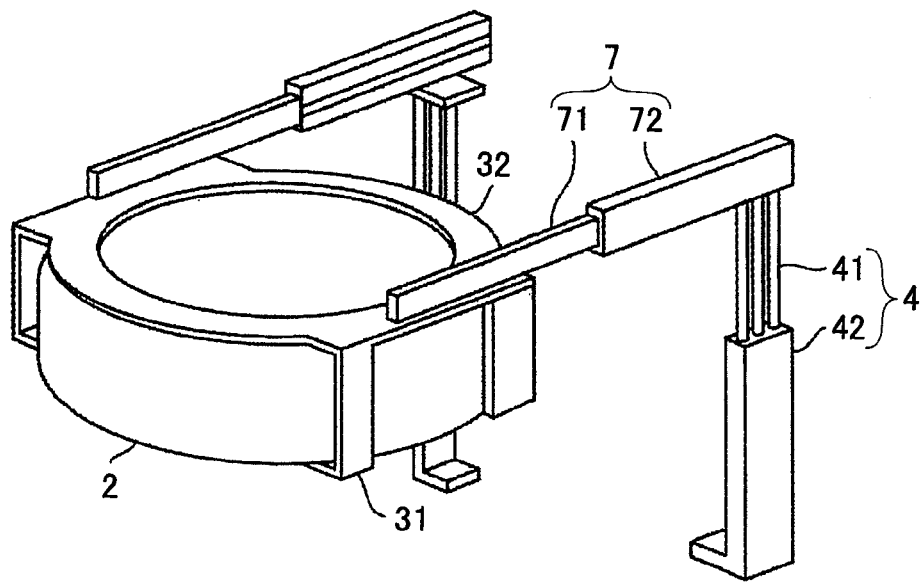

FIGS. 9A and 9B are diagrams for explaining the liquid treatment apparatus according to a second embodiment provided with such a moving mechanism 7.

There, FIG. 9A is an oblique view diagram showing g the cup holding part 3 (support member 31 and the holding member 32) holding the cup body 2 in the state mounted upon the liquid treatment apparatus and the elevating mechanism (motor cylinder 4) and the moving mechanism 7 used for the moving the cup holding part 3. Further, FIG. 9B shows the oblique view of the state after the mechanisms 4 and 7 are activated for the same liquid treatment apparatus.

With the second embodiment, it is noted that the moving mechanism 7 is attached to the tip end of the cylinder rod 42 forming the motor cylinder 4 generally perpendicularly to the direction of the up and down movement of the cup body holding part 3, wherein the cup body holding part 3 is fixed upon this moving mechanism 7. With this, it becomes possible to move the cup body holding part 3 up and down between the first position and second position and further between the second position and a third position offset in a lateral direction of the cup body (generally horizontally to the direction in which the operator pulls out the cup body 2).

Further, with the second embodiment, the entire top surface and the entire bottom surface of the cup body 2 of ring shape are held respectively by the support member 31 and the holding member 32, wherein it is possible to bring out the cup body 2 by drawing out a slider 72, which slides along a rail 71 of the moving mechanism 7, from the rail 71 together with the cup body 2 and the cup body holding part 3.

With the foregoing construction, the cup body 2 thus lifted up is moved further by the moving mechanism 7 in the maintenance direction, in which the operator can take out the cup body 2. Thus, it becomes further possible to reduce the work load of the operator bringing the cup body 2 out from the liquid treatment apparatus.

At the time of bringing the cup body 2 into the liquid treatment apparatus, too, there is no longer the need of bringing the cup body 2 into the deep interior of the housing 10, and the work load of the operator is reduced also from this respect.

Further, it is possible to use a restriction member having the function of judging whether or not the cup body 2 has been mounted upon the cup body holding part 3 properly, in place of the spring member 35 used in the fist embodiment for the restriction member.

Figure 10A:
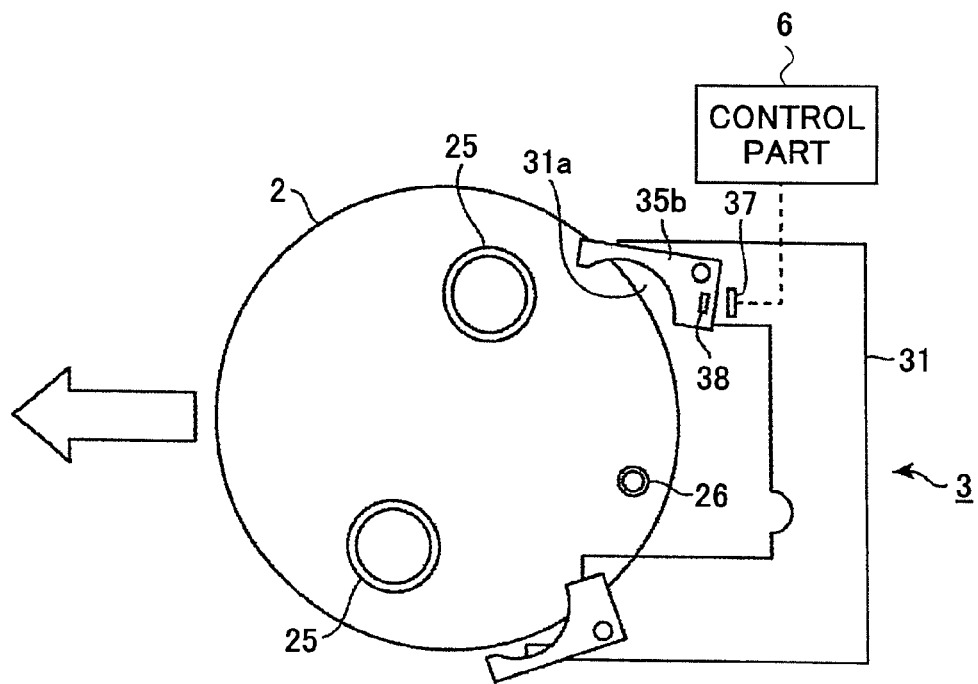
FIGS. 10A and 10B are diagrams showing the operation of the liquid treatment apparatus according to a third embodiment of the present invention.
Figure 10B:
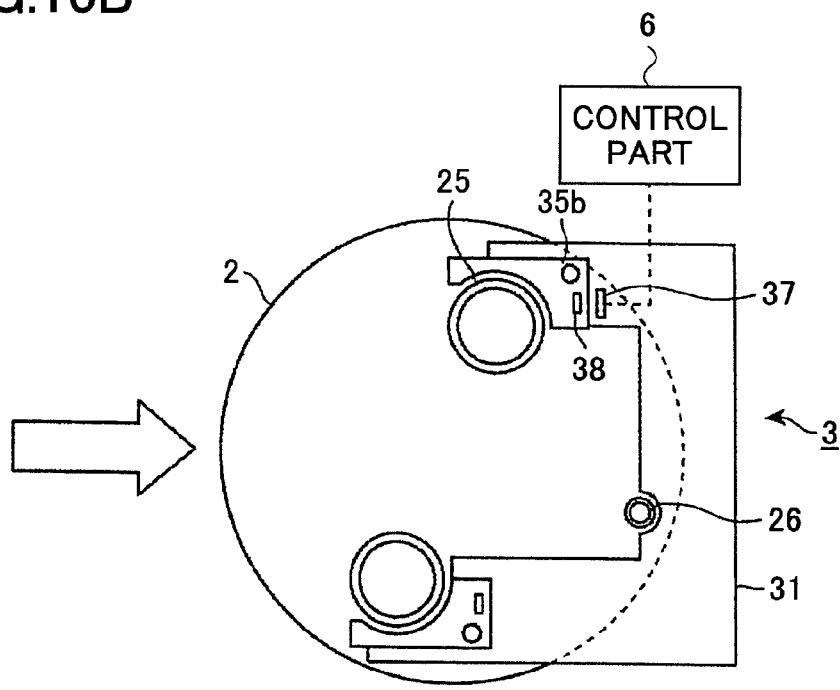

FIGS. 10A and 10B are diagrams explaining the liquid treatment apparatus according to the third embodiment as viewed from a bottom direction. FIG. 10A shows the state in which the cup body 2 is dismounted from the cup body holding part 3, while FIG. 10B shows the state in which the cup body 2 is mounted.

With the cup body holding part 3 of the third embodiment, it should be noted that there are provided two brackets 35b at the respective tip ends of the extension parts formed at the right end and left end of the support member 31 as the restriction member. Each of the brackets 35b is formed with an arc-shaped cutout so as to make engagement with the evacuation port 25 at the right or at the left, wherein each of the brackets 35b is fixed upon the support member 31 so as to be rotatable about a rotational axis at a proximity end thereof.

With such a construction, the two brackets 35b are rotated in the respective outward directions as shown in FIG. 10A when to remove the cup body 2 and the evacuation port 25 is released from the restricted state (this position of the bracket 35b will be referred to hereinafter as "open position").

At the time of mounting, the brackets 35b are pushed back by the evacuation ports 25 with pressing-in of the cup body 2 into the cup body holding part 3 as shown in FIG. 10B, and with this, the evacuation ports 25 engage with the corresponding brackets 35b at the respective cutouts.

As a result, the position of the two evacuation ports at the left and right is restricted, and the position of the cup body 2 is restricted in the circumferential direction (this position of the brackets 35b will be called "restricted position").

Further, at one side of the foregoing bracket 35b, for example, there is embedded a detection object 38, wherein the support member 31 is provided with a proximity sensor 37 that detects approach of the detection object 38 thereto. Thereby, the proximity sensor 37 performs the role of the positional sensor detecting that the bracket 35b embedded with the detection object 38 has reached the restriction position.

In the case of constructing the proximity sensor 37 by a magnetic sensor, the detection object 38 is formed by a magnetic body. In the case of constructing the proximity sensor 37 with an optical sensor, the detection sensor 38 may be a reflector reflecting the light from the sensor or a light-emitting device outputting light to the sensor.

Further, in the case of constructing the proximity sensor 37 with an electrostatic sensor, the detection object 38 may be provided with an electrode of the ground level.

The proximity sensor is connected to the control part 6, and the control part 6 performs the function of mounting judging means that judges that the cup body 2 has been properly mounted upon the cup body holding part 3 in the event a detection signal from the detection sensor 37 is received. Thereby, the control part notifies the result of the judgment to the operator via the display/operation part 63.

By providing such a function, it becomes possible to know for the operator as to whether or not the cup 2 has peen properly mounted already at the moment the cup body 2 has been mounted upon the cup body holding part 3, and there occurs no vain attempt of the operator to mount the cup body upon the liquid treatment apparatus in the event the cup body is not properly mounted upon the cup body holding part. Thereby, time loss of the operator is reduced.

Next, an example of applying the liquid treatment apparatus 1 to a developing apparatus will be explained briefly.

Figure 11:
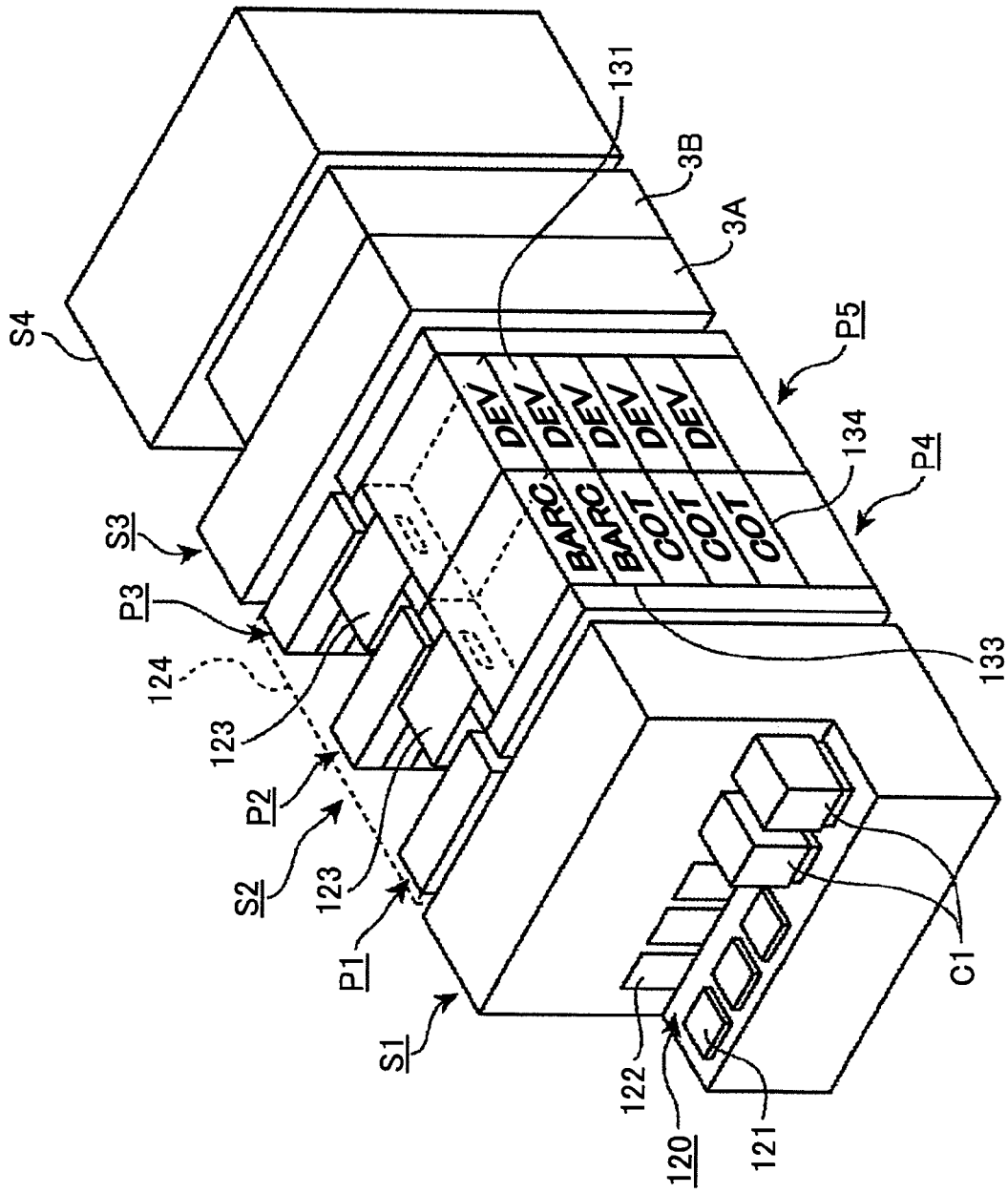
FIG. 11 is a diagram showing a coating and developing apparatus to which a coating unit of the present invention is applied in an oblique view.
Figure 12:
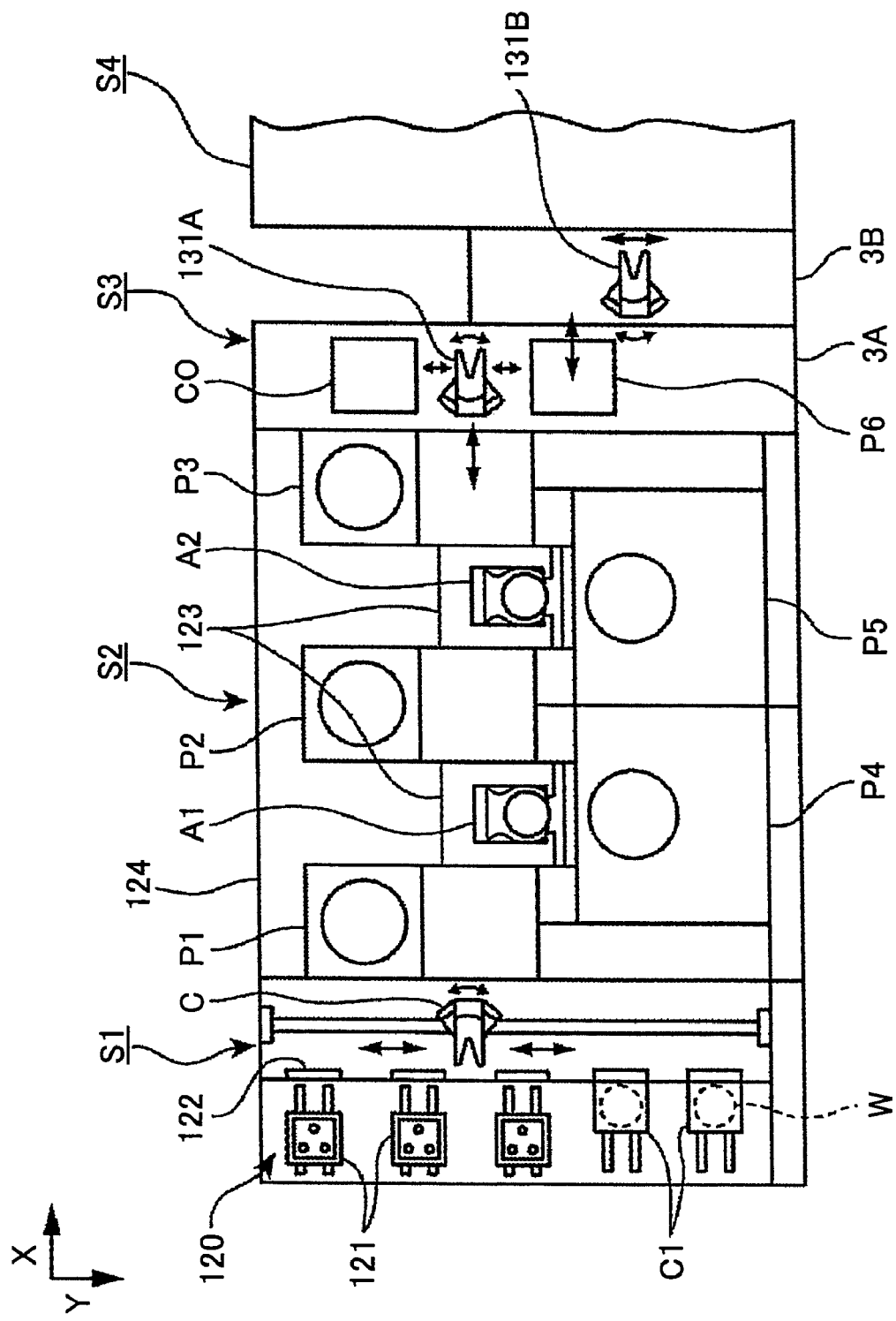
FIG. 12 is a diagram showing the coating and developing apparatus in a plan view.

FIG. 11 is an oblique view diagram showing a system in which an exposure apparatus is coupled to a developing apparatus, while FIG. 12 is a plan view diagram of the system of FIG. 10.

Referring to FIGS. 11 and 12, the system includes a carrier block S1, wherein the carrier block S1 includes therein a carrier station 120 equipped with a table 121 used for loading and unloading carriers C1 each holding thirteen wafers W, for example, in airtight state, an open/close door 122 provided in the front wall of the carrier station 120, and a transfer arm C for taking out the wafer W from the carrier C1 through the open/close door 122.

Behind the carrier block S1, there is connected a processing block S2 surrounded by a housing 124, wherein the processing block S2 includes, from the front side toward the rear side, rack units P1, P2 and P3, liquid treatment units P4 and P5, and transfer means (main arms) A1 and A2 in an alternate relationship, wherein each rack units P1, P2 and P3 have heating and cooling units tiered in multiple shelves. Thereby, the transfer means A1 and A2 plays the role of transferring wafers W between these units.

The transfer means A1 and A2 are disposed in a space 123 defined by a side portion of the rack units P1, P2 and P3 disposed in a forward direction as viewed from the carrier block S1, a side portion of the liquid treatment units P4 and P5 disposed at the right side as viewed from the carrier block S1, and a partition wall disposed at the left side as viewed from the carrier block S1.

Each of the rack units P1, P2 and P3 have a construction of stacking various units for carrying out the pre-processing and post-processing that are carried out with the liquid treatment units P4 and P5.

Such processing unit forming the stack includes a plurality of heating units (PAB) for baking the wafer W and cooling units for cooling the wafer W.

The liquid treatment units P4 and P5 may include therein various units such as bottom antireflection coating (BARC) application unit 133, a resist application unit (COT) 134, a developing unit (DEV) 131, and the like, on a liquid holding part holding the resist liquid or developing liquid in the form of stack of multiple layers such as five layers.

Here, each of the bottom antireflection coating unit 133, the resist application unit and the developing unit 131 has the construction generally identical to the liquid treatment apparatus 1 explained with the fist embodiment with regard to the structure thereof that performs the function of bringing the cup body 2 in and bringing the cup body 2 out.

Behind the processing block S2, there is provided an interface block S3 between the processing block S2 and an exposure block S4, wherein the interface block S3 is formed of a first transfer chamber 3A and a second transfer chamber 3B behind the first transfer chamber 3A. There, the first and second transfer chambers 3A and 3B include respectively wafer transfer mechanisms 131A and 131B in a manner movable up and down, rotatable about a vertical axis and movable forward and backward as desired.

Thereby, the first transfer chamber 3A is provided with a rack unit P6 and a buffer cassette CO.

Further, the rack unit P6 has the construction of stacking, in vertical direction, the transfer stage (TRS) between the wafer transfer mechanism 131A and the wafer transfer mechanism 131B and a high precision temperature regulation unit including therein a heating unit (PEB) for heating the wafer after the exposure processing and a cooling plate.

Next, the flow of wafer processing conducted with the coating and developing apparatus of FIGS. 10 and 12.

First a carrier C1 accommodating therein a wafer W is incorporated into the carrier block S1 from outside. There, the wafer W is transferred along the path of: transfer arm C→transfer unit (TRS) of the rack unit P1→transfer means A1→bottom antireflection coating (BARC) formation unit 133→transfer means A1 (A2)→heating unit→transfer means A1 (A2)→cooling unit→hydrophobic processing unit→transfer means A1 (A2)→cooling unit→transfer means A1 (A2)→resist coating unit (COT) 134→transfer means A1 (A2)→heating unit→transfer means A1 (A2) →cooling unit→transfer means A1→transfer unit (TRS) of rack unit P3→wafer transfer mechanism 131A→transfer unit (TRS) of rack unit P6→wafer transfer mechanism 131B→exposure unit S4.

After the exposure processing, the wafer W is transferred along the path of: wafer transfer mechanism 131B→transfer stage (TRS) of the rack unit P6→wafer transfer mechanism 131A→heating unit of rack unit P6→wafer transfer mechanism 131A→temperature regulation unit of rack unit P6→wafer transfer mechanism 131A→transfer stage (TRS) of rack unit P3→transfer means A2→developing unit 131→transfer means A1→transfer unit (TRS) of rack unit P1→transfer arm C. Further, the wafer W is returned to the carrier C1, and the coating and developing process is completed.

The present invention is based on Japanese priority applications 2006-287966 and 2007-119541 respectively filed on Oct. 23, 2006 and Apr. 27, 2007, the entire contents of which are incorporated herein as reference.

What is claimed is:

1. A method of mounting and dismounting a cup body in a liquid treatment apparatus treating a surface of a substrate held generally horizontally on a stage in a housing by supplying a treating liquid to said surface from a supply nozzle, comprising the steps of:

holding a cup body provided so as to surround said substrate held on said stage laterally in a manner detachable to and from a cup body holding part, said cup body being mounted detachably to a base inside said housing from an upward direction thereof; and moving said cup body holding part up and down between a first position at which said cup body is mounted upon said base and a second position located above said first position, wherein said second position is set to a height in which said cup body dismounted from said cup body holding part is taken out straight from an opening formed at a sidewall of said housing without causing interference with other devices.

2. The method as claimed in claim 1, wherein said cup body holding part holds said cup body in a manner detachable in a lateral direction.

3. The method as claimed in claim 1, further comprising the step of causing said cup body holding part to move between said second position and a third position offset from said second position in a lateral direction.

4. The method as claimed in claim 1, wherein said cup body is assembled by a plurality of ring members stacked with each other, in said step of holding said cup body in said cup body holding part, said cup body holding part being configured to hold said cup body properly from a top direction and a bottom direction thereof only when said ring members are properly assembled.

5. The method as claimed in claim 4, wherein said cup body holding part includes an elastic member configured to hold said cup body from said top direction and said bottom direction.

6. The method as claimed in claim 1, wherein there is provided an evacuation port connectable to an evacuation line evacuating a space inside said cup body and there is provided a drain port connectable to a drain line discharging a liquid that has fallen into said cup body, said evacuation port and said drain port being provided to a bottom surface of said cup body, said step of holding said cup body to said cup body holding part holding said cup body such that said cup body is positioned with regard to a circumferential direction thereof by restricting a position of at least one of said evacuation port and said drain port by a restriction member provided to said cup body holding part.

7. The method as claimed in claim 6, wherein said restriction member restricts a position of at least one of said evacuation port and said drain port when at a restriction position and when mounting said cup body upon said cup body holding part, said restriction member being configured to be moved to an open position when dismounting said cup body from said cup body holding part, said mounting and dismounting method further including the steps of: detecting that said restriction member has reached said restriction position; judging, based upon a detection result of said detection step, whether or not said cup body has been mounted properly upon said cup body holding part; and notifying a result of judgment of said judging step.

8. The method as claimed in claim 1, wherein there is provided a drain port connectable to a drain line ejecting a liquid that has fallen into said cup body at a bottom surface of said cup body, and wherein said drain port disconnected from said drain line is closed, in said step of moving said cup body holding part up, by a liquid catch mechanism provided to said cup body holding part.

9. The method as claimed in claim 1, further comprising the steps of:
  detecting, in a step of moving said cup body holding part from said second position to said first position, whether or not said cup body holding part has reached said first position; and
  judging, when said detection step did not detect that said cup body holding part has reached said first position, that said cup body has not been mounted upon said liquid treatment apparatus.

10. The method as claimed in claim 9, further comprising the step of notifying a result of judgment of said step of judging.

11. A method of mounting and dismounting a cup body in a liquid treatment apparatus treating a surface of a substrate held generally horizontally on a stage in a housing by supplying a treating liquid to said surface from a supply nozzle, comprising the steps of:
  holding a cup body provided so as to surround said substrate held on said stage laterally in a manner detachable to and from a cup body holding part, said cup body being mounted detachably to a base inside said housing from an upward direction thereof; and
  moving said cup body holding part up and down between a first position at which said cup body is mounted upon said base and a second position located above said first position,
  wherein said cup body is assembled by a plurality of ring members stacked with each other, in said step of holding said cup body in said cup body holding part, said cup body holding part being configured to hold said cup body properly from a top direction and a bottom direction thereof only when said ring members are properly assembled, and
  wherein said cup body holding part includes an elastic member configured to hold said cup body from said top direction and said bottom direction.

12. The method as claimed in claim 11, wherein said cup body holding part holds said cup body in a manner detachable in a lateral direction.

13. The method as claimed in claim 11, further comprising the step of causing said cup body holding part to move between said second position and a third position offset from said second position in a lateral direction.

14. The method as claimed in claim 11, wherein there is provided a drain port connectable to a drain line ejecting a liquid that has fallen into said cup body at a bottom surface of said cup body, and wherein said drain port disconnected from said drain line is closed, in said step of moving said cup body holding part up, by a liquid catch mechanism provided to said cup body holding part.

15. The method as claimed in claim 11, further comprising the steps of:
  detecting, in a step of moving said cup body holding part from said second position to said first position, whether or not said cup body holding part has reached said first position; and
  judging, when said detection step did not detect that said cup body holding part has reached said first position, that said cup body has not been mounted upon said liquid treatment apparatus.

16. The method as claimed in claim 15, further comprising the step of notifying a result of judgment of said step of judging.

17. A method of mounting and dismounting a cup body in a liquid treatment apparatus treating a surface of a substrate held generally horizontally on a stage in a housing by supplying a treatment liquid to said surface from a supply nozzle, comprising the steps of:
  holding a cup body provided so as to surround said substrate held on said stage laterally in a manner detachable to and from a cup body holding part, said cup body being mounted detachably to a base inside said housing from an upward direction thereof; and
  moving said cup body holding part up and down between a first position at which said cup body is mounted upon said base and a second position located above said first position, wherein
  there is provided an evacuation port connectable to ah evacuation line evacuating a space inside said cup body,
  there is provided a drain port connectable to a drain line discharging a liquid that has fallen into said cup body, said evacuation port and said drain port are provided to a bottom surface of said cup body, and step of holding said cup body to said cup body holding part provides for holding said cup body such that said cup body is positioned with regard to a circumferential direction thereof by restricting a position of at least one of said evacuation port and said drain port by a restriction member provided to said cup body holding part.

18. The method as claimed in claim 17, wherein said cup body holding part holds said cup body in a manner detachable in a lateral direction.

19. The method as claimed in claim 17, further comprising the step of causing said cup body holding part to move between said second position and a third position offset from said second position in a lateral direction.

20. The method as claimed in claim 17, wherein there is provided a drain port connectable to a drain line ejecting a liquid that has fallen into said cup body at a bottom surface of said cup body, and wherein said drain port disconnected from said drain line is closed, in said step of moving said cup body holding part up, by a liquid catch mechanism provided to said cup body holding part.

21. The method as claimed in claim 17, further comprising the steps of:

detecting, in a step of moving said cup body holding part form said second position to said first position, whether or not said cup body holding part has reached said first position; and judging, when said detection step did not detect that said cup body holding part has reached said first position, that said cup body has not been mounted upon said liquid treatment apparatus.

22. The method as claimed in claim 21, further comprising the step of notifying a result of judgment of said step of judging.

* * * * *